(12) United States Patent
Mimura et al.

(10) Patent No.: US 12,394,749 B2
(45) Date of Patent: Aug. 19, 2025

(54) BONDING SYSTEM AND SURFACE MODIFICATION METHOD

(71) Applicant: Tokyo Electron Limited, Tokyo (JP)

(72) Inventors: Yuji Mimura, Koshi (JP); Hiroshi Maeda, Koshi (JP); Takashi Terada, Koshi (JP); Masaru Honda, Koshi (JP); Ryoichi Sakamoto, Koshi (JP); Yutaka Yamasaki, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 498 days.

(21) Appl. No.: 17/804,163

(22) Filed: May 26, 2022

(65) Prior Publication Data

US 2022/0384386 A1    Dec. 1, 2022

(30) Foreign Application Priority Data

May 27, 2021  (JP) .................................. 2021-089137

(51) Int. Cl.
*H01L 23/00*    (2006.01)
*H01J 37/32*    (2006.01)

(52) U.S. Cl.
CPC ........ *H01L 24/80* (2013.01); *H01J 37/32449* (2013.01); *H01L 24/74* (2013.01); *H01J 2237/338* (2013.01); *H01L 24/08* (2013.01); *H01L 2224/08145* (2013.01); *H01L 2224/80009* (2013.01); *H01L 2224/80896* (2013.01)

(58) Field of Classification Search
CPC . H01L 2224/80896; H01L 2224/80009; H01L 2224/08145; H01L 24/08; H01L 24/74; H01L 24/80; H01J 2237/338; H01J 37/32449

See application file for complete search history.

(56) References Cited

U.S. PATENT DOCUMENTS

2006/0154492 A1* 7/2006 Ide .................... H01L 21/02137
257/E21.262

FOREIGN PATENT DOCUMENTS

| JP | H06-302486 A | 10/1994 |
|---|---|---|
| JP | H09-298189 A | 11/1997 |
| JP | 2017-073455 A | 4/2017 |
| JP | 2020-181644 A | 11/2020 |

OTHER PUBLICATIONS

Machine translation of JP-2017-073455A (Year: 2017).*

* cited by examiner

*Primary Examiner* — Vishal I Patel
(74) *Attorney, Agent, or Firm* — Chrisman Gallo Tochtrop LLC

(57) ABSTRACT

A bonding system includes a surface modifying apparatus and a bonding apparatus. The surface modifying apparatus is configured to modify a bonding surface of a substrate to be bonded to another substrate with plasma of a processing gas. The bonding apparatus is configured to bond two substrates modified by the surface modifying apparatus by an intermolecular force. The surface modifying apparatus includes: a processing chamber configured to accommodate therein the substrate; a processing gas supply configured to supply a processing gas containing moisture into the processing chamber; and a plasma forming unit configured to form the plasma of the processing gas containing the moisture.

7 Claims, 12 Drawing Sheets

US 12,394,749 B2

BONDING SYSTEM AND SURFACE MODIFICATION METHOD

CROSS-REFERENCE TO RELATED APPLICATION

This application claims the benefit of Japanese Patent Application No. 2021-089137 filed on May 27, 2021, the entire disclosure of which is incorporated herein by reference.

TECHNICAL FIELD

The exemplary embodiments described herein pertain generally to a bonding system and a surface modification method.

BACKGROUND

In order to meet the demand for higher integration of semiconductor devices, there has been proposed a three-dimensional integration technique that stacks semiconductor devices in three dimensions. As a semiconductor manufacturing apparatus used for this three-dimensional integration technique, there is known a bonding system for bonding substrates such as, for example, semiconductor wafers or the like.

Patent Document 1 discloses a bonding system that modifies the surfaces of substrates to be bonded, hydrophilizes the modified surfaces of the substrates and bonds the hydrophilized substrates to each other by a van der Waals force and hydrogen bonding (an intermolecular force).

Patent Document 1: Japanese Patent Laid-open Publication No. 2017-073455

SUMMARY

In one exemplary embodiment, a bonding system includes a surface modifying apparatus and a bonding apparatus. The surface modifying apparatus is configured to modify a bonding surface of a substrate to be bonded to another substrate with plasma of a processing gas. The bonding apparatus is configured to bond two substrates modified by the surface modifying apparatus by an intermolecular force. The surface modifying apparatus includes: a processing chamber configured to accommodate therein the substrate; a processing gas supply configured to supply a processing gas containing moisture into the processing chamber; and a plasma forming unit configured to form the plasma of the processing gas containing the moisture.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numerals in different figures indicates similar or identical items.

DETAILED DESCRIPTION

Figure 1:
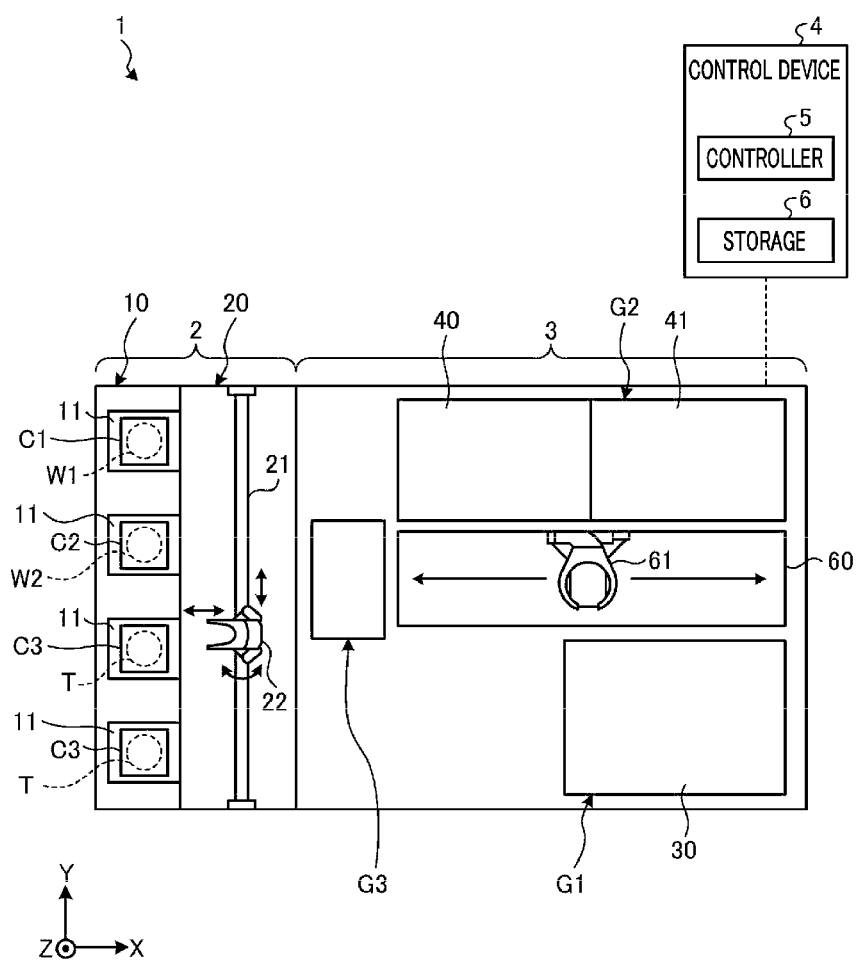
FIG. 1 is a schematic plan view illustrating a configuration of a bonding system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

The following exemplary embodiments are examples for describing the present disclosure, and the present disclosure is not limited thereto. In the following description, same parts or parts having same function will be assigned same reference numerals, and redundant description will be omitted.

Hereinafter, embodiments (hereinafter, referred to as "exemplary embodiments") of a bonding system and a surface modification method according to the present disclosure will be described in detail with reference to the accompanying drawings. Further, the present disclosure is not limited to the following exemplary embodiments. Furthermore, the exemplary embodiments and modification example can be appropriately combined as long as processing contents are not contradictory to each other. Also, in each of the exemplary embodiments and modification example described below, same parts will be assigned same reference numerals, and redundant description will be omitted.

Further, in the following exemplary embodiments, expressions such as "constant", "perpendicular", "vertical" and "parallel" may be used. These expressions, however, do not imply strictly "constant", "perpendicular", "vertical" and "parallel". That is, these expressions allow some tolerable errors in, for example, manufacturing accuracy, installation accuracy, or the like.

In order to ease understanding of the following description, the X-axis direction, Y-axis direction and Z-axis direction which are orthogonal to each other are defined, and an orthogonal coordinate system in which the positive Z-axis direction is regarded as a vertically upward direction may be used in the following drawings. Further, a rotational direction around a vertical axis may be referred to as "θ direction".

It is to be noted that the drawings are illustrative of the invention, and a relationship between the sizes of components and the proportions of the respective components can be different from the real ones. Also, the drawings may be different from each other in a relationship between the sizes of components and the proportions of the respective components.

According to a conventional method of bonding substrates such as semiconductor wafers or the like, the surfaces of substrates to be bonded are modified, the modified surfaces of the substrates are hydrophilized and the hydrophilized substrates are bonded to each other by a Van der Waals force and hydrogen bonding (an intermolecular force).

Meanwhile, if a metal wiring is provided in a bonding surface of a substrate, the metal wiring may be damaged by plasma of a processing gas in a surface modification processing using the plasma. Also, if the bonding quality of a combined substrate is degraded due to the degraded bonding surface, the yield of elements to be formed in the combined substrate may decrease.

Therefore, there is an expectation of a technique capable of overcoming the above-mentioned problems and improving the bonding quality of a combined substrate.

Also, surface modification of a substrate is performed using a surface modifying apparatus. The surface modifying apparatus accommodates a substrate within a processing chamber and modifies the surface of the accommodated substrate with plasma of a processing gas.

If the surface modification of the substrate is repeatedly performed within the processing chamber of the surface modifying apparatus, the amount of moisture within the processing chamber is gradually decreased by vacuum evacuation or the like. When the amount of moisture within the processing chamber is decreased, the state of the plasma of the processing gas formed within the processing chamber is changed. Therefore, the surface modification of the substrate is not sufficiently performed. As a result, when the modified substrate is bonded to another substrate, the bonding strength between the substrates may decrease, which may cause problems such as peeling of the substrate. Under these circumstances, there is an expectation of a technique capable of improving the bonding quality of a combined substrate.

<Configuration of Bonding System>

Figure 2:
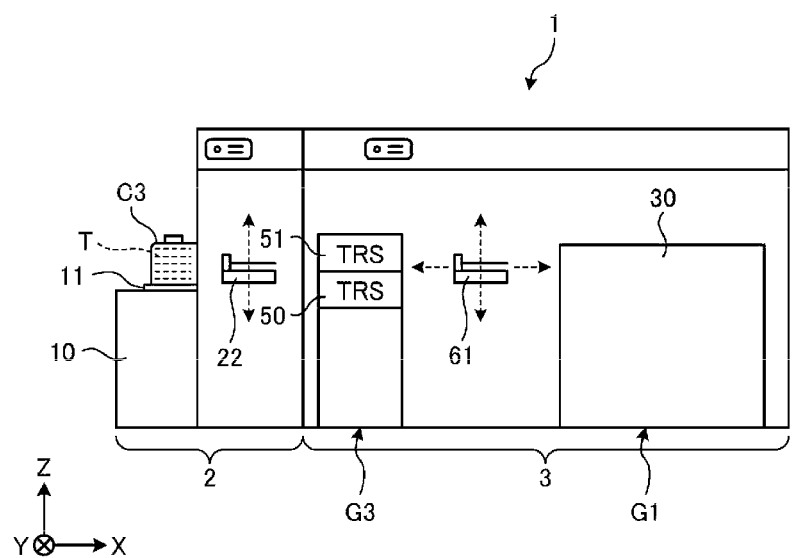
FIG. 2 is a schematic side view illustrating the configuration of the bonding system according to the exemplary embodiment.
Figure 3:
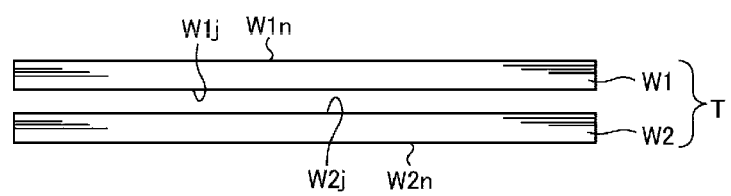
FIG. 3 is a schematic side view illustrating an upper wafer and a lower wafer according to the exemplary embodiment.

First, a configuration of a boding system 1 according to an exemplary embodiment will be described with reference to FIG. 1 to FIG. 3. FIG. 1 is a schematic plan view illustrating the configuration of the bonding system 1 according to an exemplary embodiment, and FIG. 2 is a schematic side view illustrating the same. Also, FIG. 3 is a schematic side view illustrating an upper wafer W1 and a lower wafer W2 according to an exemplary embodiment.

The bonding system 1 shown in FIG. 1 forms a combined substrate T by bonding a first substrate W1 and a second substrate W2.

The first substrate W1 is, for example, a semiconductor substrate such as a silicon wafer or a compound semiconductor wafer on which a plurality of electronic circuits is formed. Also, the second substrate W2 is, for example, a bare wafer on which no electronic circuit is formed. The first substrate W1 and the second substrate W2 have the substantially same diameter. Further, an electronic circuit may be formed on the second substrate W2.

In the following description, the first substrate W1 may be referred to as "upper wafer W1" and the second substrate W2 may be referred to as "lower wafer W2". That is, the upper wafer W1 is an example of the first substrate and the lower wafer W2 is an example of the second substrate. Also, the upper wafer W1 and the lower wafer W2 may be collectively referred to as "wafer W".

Further, in the following description, as depicted in FIG. 3, among surfaces of the upper wafer W1, a surface to be bonded to the lower wafer W2 will be referred to as "bonding surface W1j" and a surface opposite to the bonding surface W1j will be referred to as "non-bonding surface W1n". Further, among surfaces of the lower wafer W2, a surface to be bonded to the upper wafer W1 will be referred to as "bonding surface W2j" and a surface opposite to the bonding surface W2j will be referred to as "non-bonding surface W2n".

As shown in FIG. 1, the bonding system 1 includes a carry-in/out station 2 and a processing station 3. The carry-in/out station 2 and the processing station 3 are arranged in this sequence along the positive X-axis direction. Further, the carry-in/out station 2 and the processing station 3 are connected as a single body.

The carry-in/out station 2 includes a placing table 10 and a transfer section 20. The placing table 10 is equipped with a plurality of placing plates 11. Provided on the placing plates 11 are cassettes C1, C2 and C3 each of which accommodates therein a plurality of (for example, 25 sheets of) substrates horizontally. For example, the cassette C1 accommodates therein the upper wafers W1; the cassette C2, the lower wafers W2; and the cassettes C3, the combined wafers T.

The transfer section 20 is provided adjacent to the positive X-axis side of the placing table 10. Provided in the transfer section 20 are a transfer path 21 extended in the Y-axis direction and a transfer device 22 configured to be movable along the transfer path 21.

The transfer device 22 is configured to be movable in the X-axis direction as well as in the Y-axis direction and pivotable around the Z-axis. Further, the transfer device 22 is configured to transfer the upper wafers W1, the lower wafers W2 and the combined wafers T between the cassettes C1 to C3 placed on the placing plates 11 and a third processing block G3 of the processing station 3 to be described later.

Further, the number of the cassettes C1 to C3 placed on the placing plates 11 is not limited to the shown example. In addition to the cassettes C1 to C3, a cassette or the like for collecting a problematic substrate may be further provided on the placing plates 11.

A plurality of, for example, three processing blocks G1, G2 and G3 equipped with various kinds of devices is provided in the processing station 3. For example, the first processing block G1 is provided on the front side (negative Y-axis side of FIG. 1) of the processing station 3, and the second processing block G2 is provided on the rear side (positive Y-axis side of FIG. 1) of the processing station 3. Further, the third processing block G3 is provided on the carry-in/out station 2 side (negative X-axis side of FIG. 1) of the processing station 3.

Provided in the first processing block G1 is a surface modifying apparatus 30 configured to modify the bonding surfaces W1j and W2j of the upper wafer W1 and the lower wafer W2 with plasma of a processing gas. In the surface modifying apparatus 30, for example, a given processing gas is excited into plasma under a decompressed atmosphere to be ionized or radicalized. As the ions (radicals) of the element contained in the processing gas are radiated to the bonding surfaces W1j and W2j of the upper wafer W1 and the lower wafer W2, the bonding surfaces W1j and W2j are plasma-processed to be modified.

For example, if a nitrogen gas is used as the processing gas, the surface modifying apparatus 30 may form dangling bonds on the bonding surfaces W1j and W2j of the upper wafer W1 and the lower wafer W2 by plasma radiation. In this case, the surface modifying apparatus 30 may modify the bonding surfaces W1j and W2j to be easily hydrophilized afterwards.

Meanwhile, the surface modifying apparatus 30 according to the exemplary embodiment forms plasma using a gas containing moisture (for example, water vapor) as the processing gas. When the processing gas containing moisture is excited into plasma, OH radicals and H radicals are generated. The surface modifying apparatus 30 may form dangling bonds on the bonding surfaces W1j and W2j with OH radicals and terminate the dangling bonds with OH groups. Also, the surface modifying apparatus 30 according to the exemplary embodiment may remove a metal oxide formed on the surface of a metal (for example, Cu wiring) exposed on the bonding surfaces W1j and W2j by reducibility of H radicals. The surface modifying apparatus 30 will be described in detail later.

Further, a surface hydrophilizing apparatus 40 and a bonding apparatus 41 are placed in the second processing block G2. The surface hydrophilizing apparatus 40 is configured to hydrophilize and clean the bonding surfaces W1j and W2j of the upper wafer W1 and the lower wafer W2 with, for example, pure water.

The surface hydrophilizing apparatus 40 supplies the pure water onto the upper wafer W1 or the lower wafer W2 while rotating the upper wafer W1 or the lower wafer W2 held by, for example, a spin chuck. Accordingly, the pure water supplied onto the upper wafer W1 or the lower wafer W2 is diffused on the bonding surface W1j of the upper wafer W1 or the bonding surface W2j of the lower wafer W2. Thus, the bonding surfaces W1j and W2j are hydrophilized.

The bonding apparatus 41 bonds the upper wafer W1 and the lower wafer W2 to each other. The bonding apparatus 41 will be described in detail later.

In the third processing block G3, as shown in FIG. 2, transition (TRS) devices 50 and 51 for the upper wafer W1, the lower wafer W2 and the combined wafer T are provided in two levels in this order from below.

Further, as shown in FIG. 1, a transfer section 60 is formed in a region surrounded by the first processing block G1, the second processing block G2 and the third processing block G3. A transfer device 61 is provided in the transfer section 60. The transfer device 61 is equipped with, for example, a transfer arm which is configured to be movable in a vertical direction and a horizontal direction and pivotable around a vertical axis.

The transfer device 61 is moved within the transfer section 60 and transfers the upper wafers W1, the lower wafers W2 and the combined wafers T with respect to given devices within the first processing block G1, the second processing block G2 and the third processing block G3 which are adjacent to the transfer section 60.

The bonding system 1 further includes a control device 4. The control device 4 controls an operation of the bonding system 1. The control device 4 may be implemented by, for example, a computer and includes a controller 5 and a storage 6. The storage 6 stores a program for controlling various processings such as a bonding processing. The controller 5 controls an operation of the bonding system 1 by reading out the program stored in the storage 6 and executing the program.

Further, the program may be recorded on a computer-readable recording medium and installed from the recording medium to the storage 6 of the control device 4. The computer-readable recording medium may be, for example, a hard disk (HD), a flexible disk (FD), a compact disk (CD), a magnetic optical disk (MO), a memory card, or the like.

<Configuration of Surface Modifying Apparatus>

Figure 4:
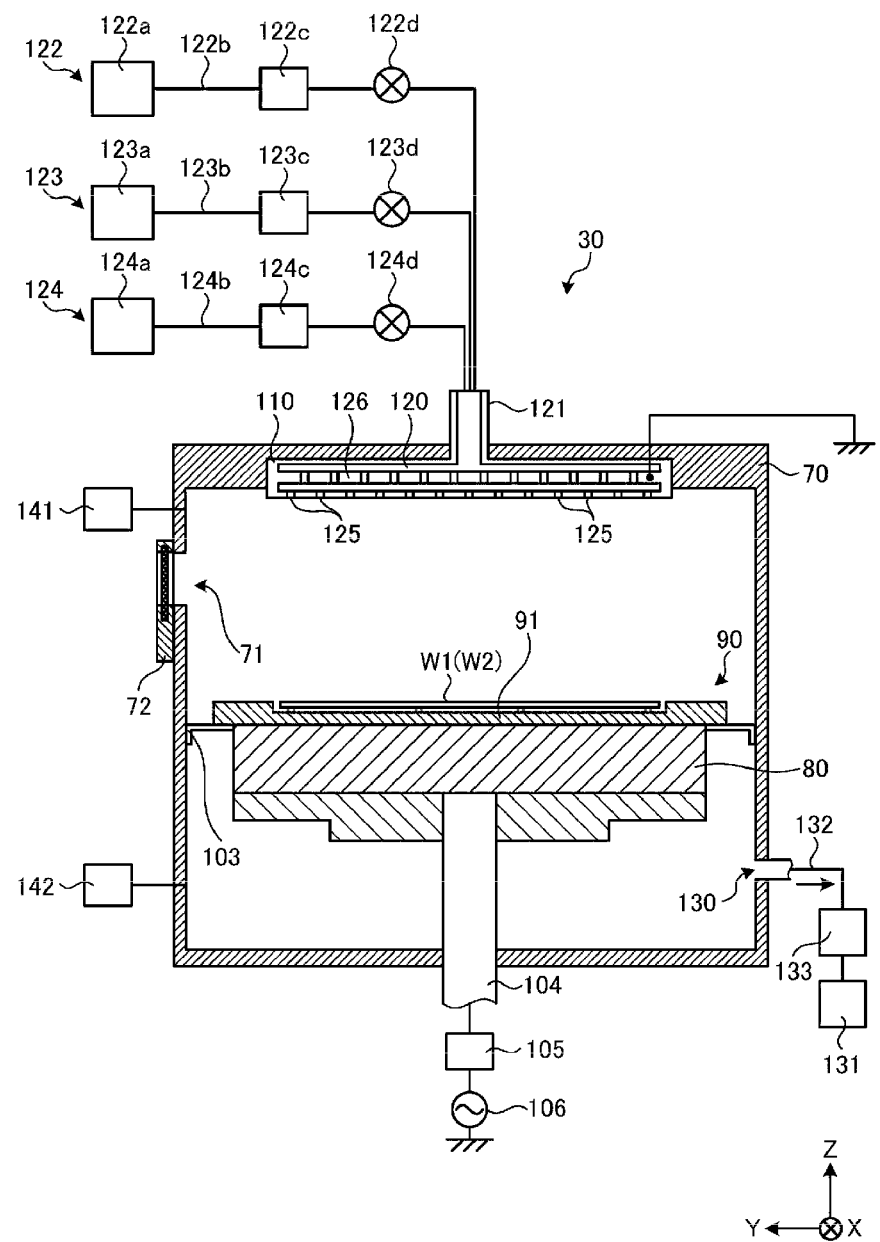
FIG. 4 is a schematic cross-sectional view illustrating a configuration of a surface modifying apparatus according to the exemplary embodiment.

Hereinafter, a configuration of the surface modifying apparatus 30 will be described with reference to FIG. 4. FIG. 4 is a schematic cross-sectional view illustrating the configuration of the surface modifying apparatus 30 according to the exemplary embodiment.

As shown in FIG. 4, the surface modifying apparatus 30 includes a processing chamber 70 configured to be a hermetically sealed. A carry-in/out opening 71 for the upper wafer W1 or the lower wafer W2 is formed on a side surface of the processing chamber 70 on the transfer section 60 side (see FIG. 1). A gate valve 72 is provided at the carry-in/out opening 71.

A stage 80 is placed within the processing chamber 70. The stage 80 may serve as, for example, a lower electrode and may be made of a conductive material such as aluminum or the like. The stage 80 is provided with a non-illustrated pin through hole, and a non-illustrated lifter pin is accommodated in the pin through hole. The lifter pin is configured to be movable up and down by a non-illustrated lift mechanism.

An upper surface of the stage 80, i.e., a surface facing an upper electrode 110, is a circular horizontal surface having a greater diameter than the upper wafer W1 and the lower wafer W2 when viewed from the top. A stage cover 90 is placed on the upper surface of the stage 80, and the upper wafer W1 or the lower wafer W2 is placed on a placing portion 91 of the stage cover 90.

A ring-shaped partition plate 103 including a plurality of baffle holes is placed between the stage 80 and an inner wall of the processing chamber 70. The partition plate 103 is also referred to as an evacuation ring. An inner space of the processing chamber 70 is divided by the partition plate 103 into upper and lower spaces with the placing portion 91 therebetween. An atmosphere within the processing chamber 70 is uniformly evacuated from the processing chamber 70 by the partition plate 103.

A power feed rod 104 made of a conductor is connected to a lower surface of the stage 80. The power feed rod 104 is connected to a high frequency power supply 106 via a matching unit 105 including, for example, a blocking capacitor or the like. When a plasma processing is performed, a given high frequency voltage is applied to the stage 80 from the high frequency power supply 106.

The upper electrode 110 is placed within the processing chamber 70. The upper surface of the stage 80 and a lower surface of the upper electrode 110 are arranged in parallel to face each other with a given distance therebetween.

The upper electrode 110 is grounded and connected to a ground potential. Since the upper electrode 110 is grounded, it is possible to suppress damage to the lower surface of the upper electrode 110 during the plasma processing.

As described above, the high frequency voltage is applied from the high frequency power supply 106 to the stage 80 serving as the lower electrode, and, thus, plasma is formed within the processing chamber 70.

In the exemplary embodiment, the stage 80, the power feed rod 104, the matching unit 105, the high frequency power supply 106, the upper electrode 110 are an example of a plasma forming unit configured to form plasma of a processing gas within the processing chamber 70. Further, the high frequency power supply 106 is controlled by the controller 5 of the control device 4.

A hollow portion 120 is formed within the upper electrode 110. The hollow portion 120 is connected to a gas supply pipe 121. The gas supply pipe 121 is connected to a processing gas supply 122, an inert gas supply 123 and a purge gas supply 124.

The processing gas supply 122 supplies a processing gas containing moisture ($H_2O$) into the hollow portion 120 of the upper electrode 110 through the gas supply pipe 121. The processing gas containing moisture is, for example, water vapor. The processing gas containing moisture may also contain a carrier gas in addition to moisture. The carrier gas may be an inert gas such as a nitrogen gas, an argon gas or a helium gas.

The processing gas supply 122 is equipped with a processing gas source 122a, a processing gas supply line 122b, a flow rate controller 122c and an opening/closing valve 122d. The processing gas source 122a supplies the processing gas containing moisture (hereinafter, sometimes simply referred to as "processing gas"). The processing gas supply line 122b is a supply route to supply the processing gas and connects the processing gas source 122a and the gas supply pipe 121. The flow rate controller 122c and the opening/closing valve 122d are provided in the middle of the processing gas supply line 122b. Particularly, the flow rate controller 122c controls a flow rate of the processing gas flowing in the processing gas supply line 122b. Also, the opening/closing valve 122d opens and closes the processing gas supply line 122b.

The flow rate of the processing gas supplied from the processing gas source 122a to the processing gas supply line 122b is controlled by the flow rate controller 122c and the opening/closing valve 122d and then, the processing gas is supplied into the hollow portion 120 of the upper electrode 110 through the gas supply pipe 121.

Figure 5:
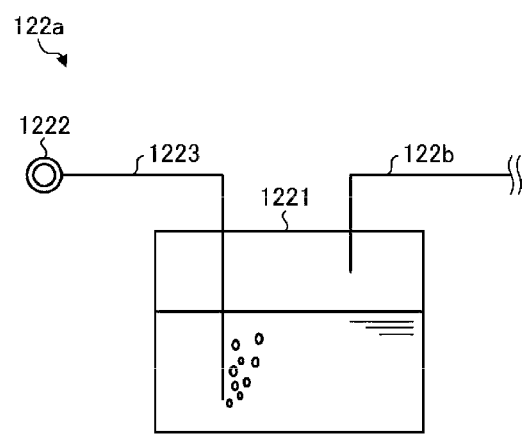
FIG. 5 shows a configuration example of a processing gas source according to the exemplary embodiment.

Hereinafter, a configuration of the processing gas source 122a will be described with reference to FIG. 5 and FIG. 6. FIG. 5 shows a configuration example of the processing gas source 122a according to the exemplary embodiment. Also, FIG. 6 shows another configuration example of the processing gas source 122a according to the exemplary embodiment.

As shown in FIG. 5, the processing gas source 122a is equipped with a reservoir 1221, a carrier gas source 1222 and a carrier gas supply line 1223. The reservoir 1221 stores therein water. The reservoir 1221 is connected to the processing gas supply line 122b. The processing gas supply line 122b is provided at a position higher than the water surface within the reservoir 1221. The reservoir 1221 is, for example, a hermetically sealed container. The carrier gas supply line 1223 connects the carrier gas source 1222 and the reservoir 1221. A tip end portion (corresponding to a carrier gas injection portion) of the carrier gas supply line 1223 is provided at a position lower than the water surface within the reservoir 1221.

The processing gas source 122a configured as described above makes bubbles of water stored in the reservoir 1221 by using a carrier gas supplied from the carrier gas source 1222 into the reservoir 1221 through the carrier gas supply line 1223. Thus, a processing gas containing components of the water and the carrier gas is generated within the reservoir 1221. The processing gas generated within the reservoir 1221 is supplied into the processing chamber 70 through the processing gas supply line 122b.

Figure 6:
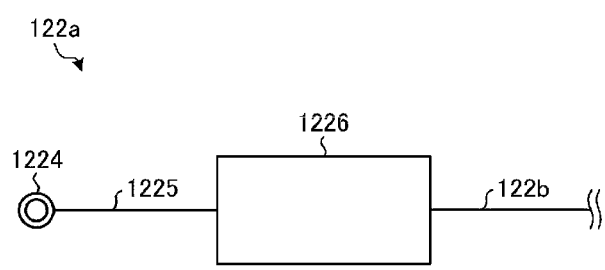
FIG. 6 shows another configuration example of the processing gas source according to the exemplary embodiment.

As shown in FIG. 6, the processing gas source 122a may be equipped with a water source 1224, a water supply line 1225 and a liquid material vaporizing apparatus 1226. The water source 1224 supplies water. The water supply line 1225 connects the water source 1224 and the liquid material vaporizing apparatus 1226. The liquid material vaporizing apparatus 1226 vaporizes the water supplied from the water source 1224 through the water supply line 1225. For example, the liquid material vaporizing apparatus 1226 may vaporize the water by heating the water supplied from the water source 1224 through the water supply line 1225. Any known technique may be used for the liquid material vaporizing apparatus 1226. The liquid material vaporizing apparatus 1226 is connected to the processing gas supply line 122b.

The processing gas source 122a configured as described above vaporizes the water supplied from the water source 1224 through the water supply line 1225 by using the liquid material vaporizing apparatus 1226. Thus, a processing gas containing the water without a carrier gas is generated, and the generated processing gas is supplied into the processing chamber 70 through the processing gas supply line 122b.

Referring back to FIG. 4, the inert gas supply 123 supplies an inert gas into the hollow portion 120 of the upper electrode 110 through the gas supply pipe 121. Examples of the inert gas may include a helium gas, an argon gas and a nitrogen gas.

The inert gas supply 123 is equipped with an inert gas source 123a, an inert gas supply line 123b, a flow rate controller 123c and an opening/closing valve 123d. The inert gas source 123a supplies the inert gas. The inert gas supply line 123b is a supply route to supply the inert gas and connects the inert gas source 123a and the gas supply pipe 121. The flow rate controller 123c and the opening/closing valve 123d are provided in the middle of the inert gas supply line 123b. Particularly, the flow rate controller 123c controls a flow rate of the inert gas flowing in the inert gas supply line 123b. Also, the opening/closing valve 123d opens and closes the inert gas supply line 123b.

The purge gas supply 124 supplies a purge gas into the hollow portion 120 of the upper electrode 110 through the gas supply pipe 121. Examples of the purge gas may include a nitrogen gas, a helium gas and an argon gas.

Further, desirably, the inert gas (first inert gas) supplied from the inert gas supply 123 may be a gas having a smaller mass than the inert gas (second inert gas) supplied from the purge gas supply 124. This will be described later. Herein, it is assumed that a helium gas is used as the first inert gas and a nitrogen gas is used as the second inert gas.

The purge gas supply 124 is equipped with a purge gas source 124a, a purge gas supply line 124b, a flow rate controller 124c and an opening/closing valve 124d. The purge gas source 124a supplies the purge gas. The purge gas supply line 124b is a supply route to supply the purge gas and connects the purge gas source 124a and the gas supply pipe 121. The flow rate controller 124c and the opening/closing valve 124d are provided in the middle of the purge gas supply line 124b. Particularly, the flow rate controller 124c controls a flow rate of the purge gas flowing in the purge gas supply line 124b. Also, the opening/closing valve 124d opens and closes the purge gas supply line 124b.

The flow rate of the inert gas supplied form the inert gas source 123a to the inert gas supply line 123b is controlled by the flow rate controller 123c and the opening/closing valve 123d and then, the inert gas is supplied into the hollow portion 120 of the upper electrode 110 through the gas supply pipe 121.

Provided within the hollow portion 120 is a baffle plate 126 for promoting a uniform diffusion of the processing gas and the inert gas. The baffle plate 126 includes a plurality of holes. A plurality of gas injection openings 125 through which the processing gas and the inert gas are injected from the hollow portion 120 into the processing chamber 70 is formed in the lower surface of the upper electrode 110.

A suction opening 130 is formed in the processing chamber 70. The suction opening 130 is connected to a suction pipe 132 that communicates with a vacuum pump 131 configured to decompress the atmosphere within the processing chamber 70 to a given vacuum level. The suction pipe 132 is provided with an auto pressure controller (APC) valve 133. The inside of the processing chamber 70 is evacuated by the vacuum pump 131 and the opening degree of the APC valve 133 is adjusted to maintain the pressure within the processing chamber 70 at a predetermined level.

The processing chamber 70 is provided with a spectrophotometer 141 configured to measure light emission data at each wavelength within the processing chamber 70. Specifically, the spectrophotometer 141 provided in the processing chamber 70 is located higher than the placing portion 91 and lower than the gas injection openings 125. The spectrophotometer 141 is, for example, an optical emission spectroscopy (OES) sensor and measures the light emission state of plasma formed within the processing chamber 70. The spectrophotometer 141 may also be a self-bias OES sensor configured to form plasma within the chamber and measure the light emission state of plasma. The spectrophotometer 141 outputs the measured light emission data to the controller 5 of the control device 4.

The processing chamber 70 is also provided with a mass spectrometer 142 configured to analyze the atmosphere within the processing chamber 70 in terms of the mass number of a specific material. Specifically, the mass spectrometer 142 provided in the processing chamber 70 is located lower than the partition plate 103. The mass spectrometer 142 is, for example, a quadrupole mass spectrometer (QMS) and measures an analysis value obtained by analyzing the atmosphere within the processing chamber 70 in terms of the mass number of a specific material. The mass spectrometer 142 outputs the measured analysis value to the controller 5 of the control device 4. Since the mass spectrometer 142 is located lower than the partition plate 103, it is possible to suppress damage to the mass spectrometer 142 caused by plasma.

<Configuration of Bonding Apparatus>

Figure 7:
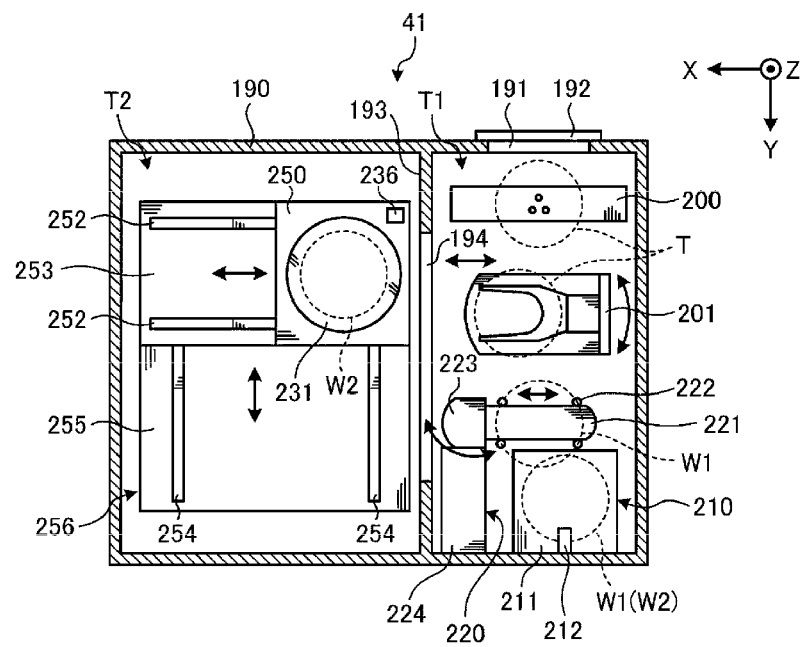
FIG. 7 is a schematic plan view illustrating a configuration of a bonding apparatus according to the exemplary embodiment.
Figure 8:
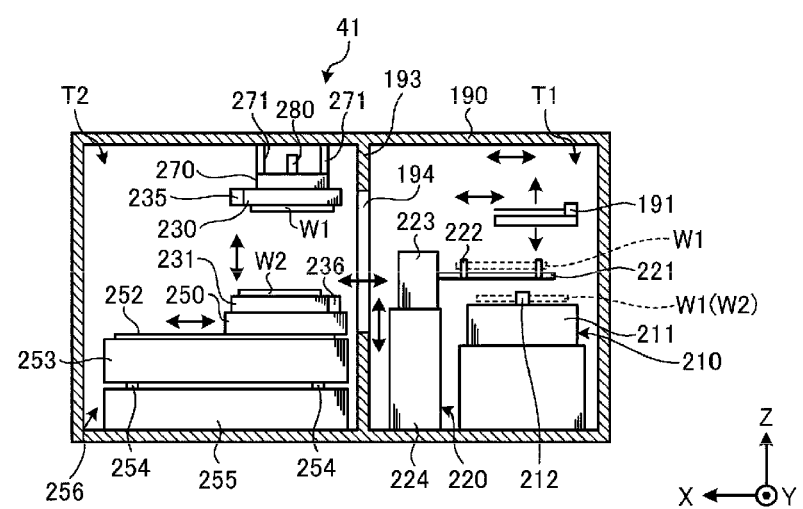
FIG. 8 is a schematic side view illustrating the configuration of the bonding apparatus according to the exemplary embodiment.

Hereinafter, a configuration of the bonding apparatus 41 will be described with reference to FIG. 7 and FIG. 8. FIG. 7 is a schematic plan view illustrating the configuration of the bonding apparatus 41 according to the exemplary embodiment, and FIG. 8 is a schematic side view illustrating the configuration of the bonding apparatus 41 according to the exemplary embodiment.

As shown in FIG. 7, the bonding apparatus 41 includes a processing chamber 190 configured to be a hermetically sealed. A carry-in/out opening 191 for the upper wafer W1, the lower wafer W2 and the combined wafer T is formed on a side surface of the processing chamber 190 on the transfer section 60. A gate valve 192 is provided at the carry-in/out opening 191.

The inside of the processing chamber 190 is divided by an inner wall 193 into a transfer region T1 and a processing region T2. The carry-in/out opening 191 is formed on the side surface of the processing chamber 190 corresponding to the transfer region T1. Also, a carry-in/out opening 194 for the upper wafer W1, the lower wafer W2 and the combined wafer T is formed in the inner wall 193.

In the transfer region T1, a transition 200, a substrate transfer mechanism 201, an inverting mechanism 220 and a position adjusting mechanism 210 are provided in this order from, for example, the carry-in/out opening 191.

The transition 200 temporarily mounts thereon the upper wafer W1, the lower wafer W2 and the combined wafer T. The transition 200 may be provided in, for example, two levels and may simultaneously mount thereon any two of the upper wafer W1, the lower wafer W2 and the combined wafer T.

The substrate transfer mechanism 201 is provided with a transfer arm that is movable in the vertical direction (Z-axis direction), the horizontal direction (Y-axis direction, X-axis direction) and around the vertical axis (θ direction). The substrate transfer mechanism 201 can transfer the upper wafer W1, the lower wafer W2 and the combined wafer T within the transfer region T1 or between the transfer region T1 and the processing region T2.

The position adjusting mechanism 210 adjusts the orientation of the upper wafer W1 and the lower wafer W2 in the horizontal direction. Specifically, the position adjusting mechanism 210 is provided with a base 211 including a non-illustrated holder that holds and rotates the upper wafer W1 and the lower wafer W2 and a detector 212 configured to detect a position of a notch of the upper wafer W1 and the lower wafer W2. The position adjusting mechanism 210 adjusts the position of the notch of the upper wafer W1 and the lower wafer W2 by detecting the position of the notch with the detector 212 while rotating the upper wafer W1 and the lower wafer W2 held by the base 211. Accordingly, the orientation of the upper wafer W1 and the lower wafer W2 in the horizontal direction is adjusted.

The inverting mechanism 220 inverts a front surface and a rear surface of the upper wafer W1. Specifically, the inverting mechanism 220 is provided with a holding arm 221 that holds the upper wafer W1. The holding arm 221 is extended in the horizontal direction (X-axis direction). Further, the holding arm 221 is provided with, for example, holding members 222 configured to hold the upper wafer W1 at four positions.

The holding arm 221 is supported by a driving unit 223 including, for example, a motor or the like. The holding arm 221 is configured to be rotatable around the horizontal axis by the driving unit 223. Further, the holding arm 221 is rotatable around the driving unit 223 and movable in the horizontal direction (X-axis direction). Another driving unit (not shown) including, for example, a motor or the like is provided under the driving unit 223. The driving unit 223 can be moved in the vertical direction along a vertically extended supporting column 224 by this another driving unit.

As described above, the upper wafer W1 held by the holding members 222 can be rotated around the horizontal axis and can also be moved in the vertical direction and the horizontal direction by the driving unit 223. Further, the upper wafer W1 held by the holding members 222 can be rotated around the driving unit 223 and moved between the position adjusting mechanism 210 and an upper chuck 230 to be described later.

Provided in the processing region T2 are the upper chuck 230 configured to hold and attract an upper surface (non-bonding surface W1n) of the upper wafer W1 from above and a lower chuck 231 configured to hold and attract a lower surface (non-bonding surface W2n) of the lower wafer W2 from below. The lower chuck 231 is provided under the upper chuck 230 to face the upper chuck 230. The upper chuck 230 and the lower chuck 231 are, for example, vacuum chucks.

As shown in FIG. 8, the upper chuck 230 is supported by a supporting member 270 provided on the upper chuck 230. The supporting member 270 is fixed to a ceiling surface of the processing chamber 190 with a plurality of supporting columns 271 interposed therebetween.

Provided at the side of the upper chuck 230 is an upper imaging unit 235 configured to image an upper surface (bonding surface W2j) of the lower wafer W2 held by the lower chuck 231. For example, the upper imaging unit 235 is implemented by a CCD camera.

The lower chuck 231 is supported by a first moving unit 250 provided under the lower chuck 231. The first moving unit 250 is configured to move the lower chuck 231 in the horizontal direction (X-axis direction), as will be described later. Further, the first moving unit 250 is also configured to move the lower chuck 231 in the vertical direction and rotate the lower chuck 231 around the vertical axis.

The first moving unit 250 is equipped with a lower imaging unit 236 configured to image a lower surface (bonding surface W1j) of the upper wafer W1 held by the upper chuck 230. For example, the lower imaging unit 236 is implemented by a CCD camera.

The first moving unit 250 is mounted to a pair of rails 252. The pair of rails 252 is provided at a lower surface side of the first moving unit 250 and extended in the horizontal direction (X-axis direction). The first moving unit 250 is configured to be movable along the rails 252.

The pair of rails 252 is provided on a second moving unit 253. The second moving unit 253 is mounted to a pair of rails 254. The pair of rails 254 is provided at a lower surface side of the second moving unit 253 and extended in the horizontal direction (Y-axis direction). This second moving unit 253 is configured to be movable in the horizontal direction (Y-axis direction) along the rails 254. Further, the pair of rails 254 is provided on a placing table 255 provided on a bottom surface of the processing chamber 190.

A position alignment unit 256 is composed of the first moving unit 250 and the second moving unit 253. The position alignment unit 256 aligns the position of the upper wafer W1 held by the upper chuck 230 with the position of the lower wafer W2 held by the lower chuck 231 in the horizontal direction by moving the lower chuck 231 in the X-axis direction, Y-axis direction and θ direction. Also, the position alignment unit 256 aligns the position of the upper wafer W1 held by the upper chuck 230 with the position of the lower wafer W2 held by the lower chuck 231 in the vertical direction by moving the lower chuck 231 in the Z-axis direction.

Although it has been described that the lower chuck 231 is moved in the X-axis direction, Y-axis direction and θ direction, the position alignment unit 256 may move, for example, the lower chuck 231 in the X-axis direction and the Y-axis direction and the upper chuck 230 in the θ direction. Further, although it has been described that the lower chuck 231 is moved in the Z-axis direction, the position alignment unit 256 may move, for example, the upper chuck 230 in the Z-axis direction.

Figure 9:
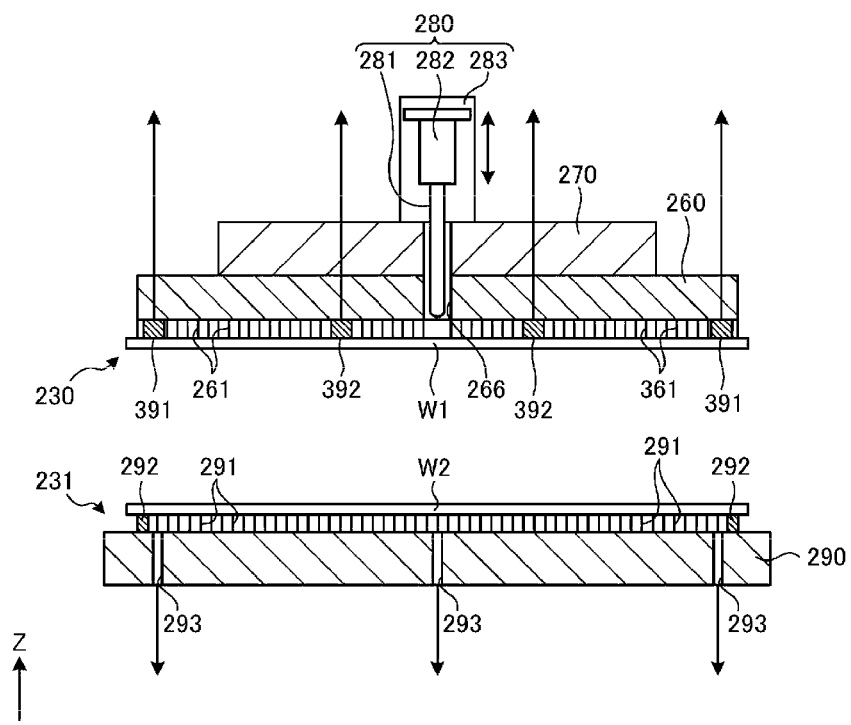
FIG. 9 is a schematic view illustrating an upper chuck and a lower chuck according to the exemplary embodiment.

Hereinafter, configurations of the upper chuck 230 and the lower chuck 231 will be described with reference to FIG. 9. FIG. 9 is a schematic view illustrating the upper chuck 230 and the lower chuck 231 according to the exemplary embodiment.

As shown in FIG. 9, the upper chuck 230 has a main body 260. The main body 260 is supported by the supporting member 270. A through hole 266 is formed through the supporting member 270 and the main body 260 in the vertical direction. A position of the through hole 266 corresponds to a central portion of the upper wafer W1 attracted to and held by the upper chuck 230. A pressing pin 281 of a striker 280 is inserted through the through hole 266.

The striker 280 is provided on an upper surface of the supporting member 270 and is equipped with the pressing pin 281, an actuator unit 282 and a linearly moving mechanism 283. The pressing pin 281 is a cylindrical member extended along the vertical direction and is supported by the actuator unit 282.

The actuator unit 282 is configured to generate a constant pressure in a certain direction (herein, vertically downward direction) by air supplied from, for example, an electro-pneumatic regulator (not shown). By the air supplied from the electro-pneumatic regulator, the actuator unit 282 can control a press load applied to the central portion of the upper wafer W1 as it is brought into contact with the central portion of the upper wafer W1. Further, a tip end portion of the pressing pin 281 is movable up and down in the vertical direction through the through hole 266 by the air from the electro-pneumatic regulator.

The actuator unit 282 is supported by the linearly moving mechanism 283. The linearly moving mechanism 283 moves the actuator unit 282 in the vertical direction by using a driving unit including, for example, a motor.

The striker 280 is configured as described above, and controls a movement of the actuator unit 282 by using the linearly moving mechanism 283 and controls the press load onto the upper wafer W1 from the pressing pin 281 by using the actuator unit 282. Accordingly, the striker 280 brings the central portion of the upper wafer W1 attracted to and held by the upper chuck 230 into contact with the lower wafer W2 by pressing the central portion of the upper wafer W1.

A plurality of pins 261 in contact with the upper surface (non-bonding surface Win) of the upper wafer W1 is provided on a lower surface of the main body 260. The plurality of pins 261 has, for example, a diameter of 0.1 mm to 1 mm and a height of several tens of μm to several hundreds of μm. The plurality of pins 261 is equally arranged at an interval of, for example, 2 mm.

The upper chuck 230 includes a plurality of attraction members for attracting the upper wafer W1 in a part of a region where the plurality of pins 261 is provided. Specifically, a plurality of outer attraction members 391 and a plurality of inner attraction members 392 configured to attract the upper wafer W1 by vacuum evacuation are provided on the lower surface of the main body 260 of the upper chuck 230. The plurality of outer attraction members 391 and the plurality of inner attraction members 392 have circular arc-shaped attraction regions when viewed from the top. Further, the plurality of outer attraction members 391 and the plurality of inner attraction members 392 have the same height as the pins 261.

The plurality of outer attraction members 391 is arranged on an outer peripheral portion of the main body 260. The plurality of outer attraction members 391 is connected to a non-illustrated suction device such as a vacuum pump and attracts an outer peripheral portion of the upper wafer W1 by vacuum evacuation.

The plurality of inner attraction members 392 is arranged along a circumferential direction on a radially inner side of the main body 260 than the plurality of outer attraction members 391. The plurality of inner attraction members 392 is connected to a non-illustrated suction device such as a vacuum pump and attracts a region between the outer peripheral portion and the central portion of the upper wafer W1 by vacuum evacuation.

The lower chuck 231 has a main body 290 having a diameter equal to or greater than the lower wafer W2. Herein, the lower chuck 231 is illustrated as having a greater diameter than the lower wafer W2. An upper surface of the main body 290 is a surface facing the lower surface (non-bonding surface W2n) of the lower wafer W2.

A plurality of pins 291 in contact with the lower surface (non-bonding surface Wn2) of the lower wafer W2 is provided on the upper surface of the main body 290. The plurality of pins 291 has, for example, a diameter of 0.1 mm to 1 mm and a height of several tens of μm to several hundreds of μm. The plurality of pins 291 is equally arranged at an interval of, for example, 2 mm.

Further, on the upper surface of the main body 290, a lower rib 292 is annularly provided outside the plurality of pins 291. The lower rib 292 is annularly formed and supports an outer peripheral portion of the lower wafer W2 along the entire circumference.

The main body 290 has a plurality of lower suction ports 293. The plurality of lower suction ports 293 is provided in an attraction region surrounded by the lower rib 292. The plurality of lower suction ports 293 is connected to a non-illustrated suction device, such as a vacuum pump, through a non-illustrated suction pipe.

The lower chuck 231 is configured to decompress the attraction region surrounded by the lower rib 292 while vacuum-evacuating the attraction region from the plurality of lower suction ports 293. Accordingly, the lower wafer W2 placed in the attraction region is attracted and held by the lower chuck 231.

Since the lower rib 292 supports the outer peripheral portion of the lower surface of the lower wafer W2 along the entire circumference, the lower wafer W2 is appropriately vacuum-evacuated to the outer peripheral portion. Thus, the entire surface of the lower wafer W2 can be attracted and held. Further, since the lower surface of the lower wafer W2 is supported by the plurality of pins 291, the lower wafer W2 can be easily separated from the lower chuck 231 when the vacuum evacuation of the lower wafer W2 is released.

<Specific Operation of Bonding System>

Figure 10:
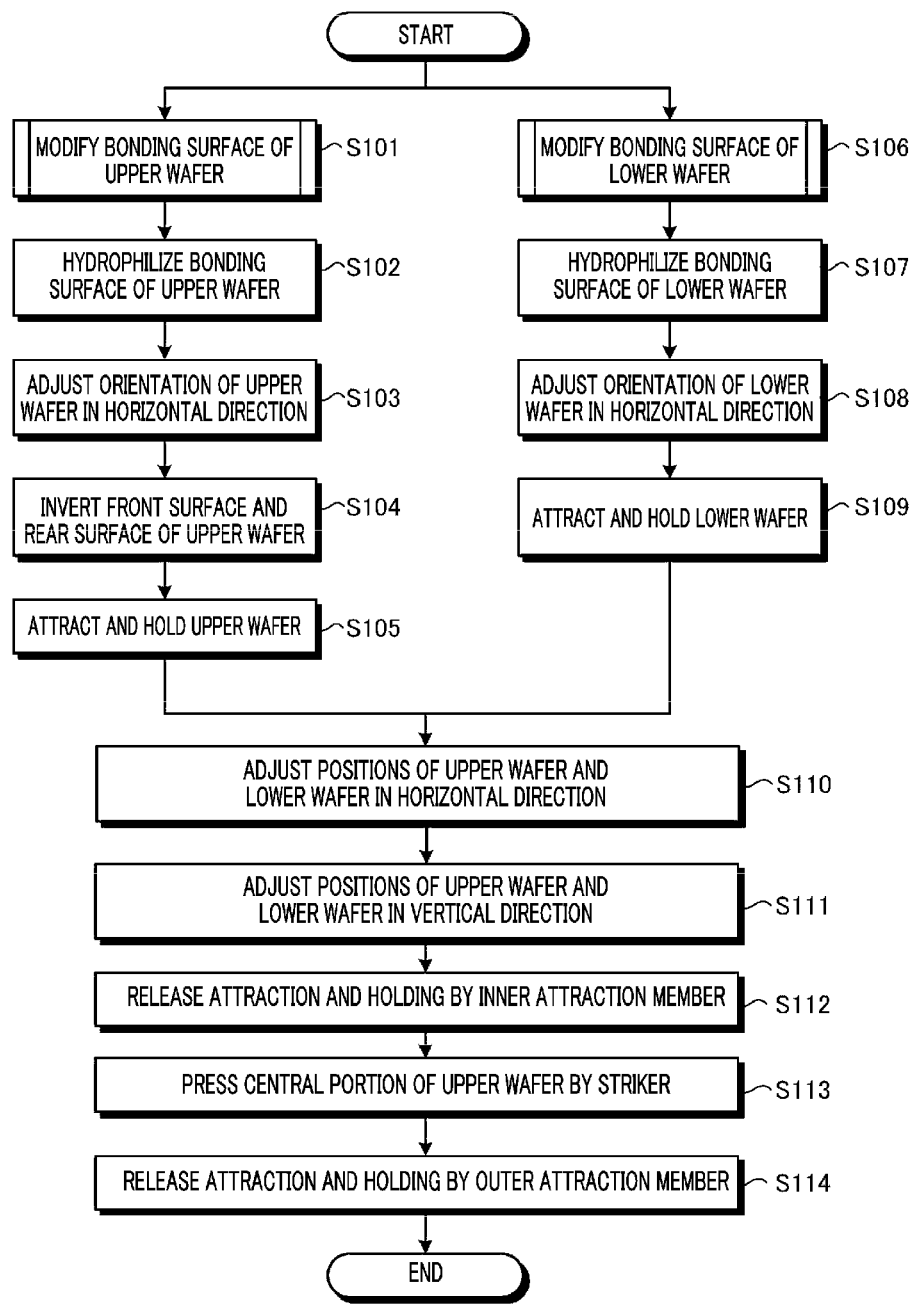
FIG. 10 is a flowchart showing a sequence of processings performed by the bonding system according to the exemplary embodiment.

Hereinafter, a specific operation of the bonding system 1 according to the exemplary embodiment will be described with reference to FIG. 10. FIG. 10 is a flowchart showing a sequence of processings performed by the bonding system 1 according to the exemplary embodiment. Further, various processings shown in FIG. 10 are performed under the control of the controller 5 of the control device 4.

First, the cassette C1 accommodating the plurality of upper wafers W1, the cassette C2 accommodating the plurality of lower wafers W2 and the empty cassette C3 are placed on the predetermined placing plates 11 of the carry-in/out station 2. Then, the upper wafer W1 in the cassette C1 is taken out by the transfer device 22 and transferred to the transition device 50 of the third processing block G3.

Then, the upper wafer W1 is transferred by the transfer device 61 to the surface modifying apparatus 30 of the first processing block G1. In the surface modifying apparatus 30, the bonding surface W1j of the upper wafer W1 is modified (process S101). This will be described later.

Thereafter, the upper wafer W1 is transferred by the transfer device 61 to the surface hydrophilizing apparatus 40 of the first processing block G1. In the surface hydrophilizing apparatus 40, pure water is supplied onto the upper wafer W1 while rotating the upper wafer W1 held on the spin chuck. As a result, the bonding surface W1j of the upper wafer W1 is hydrophilized. Further, the bonding surface W1j of the upper wafer W1 is cleaned with the pure water (process S102).

Then, the upper wafer W1 is transferred by the transfer device 61 to the bonding apparatus 41 of the second processing block G2. The upper wafer W1 carried into the bonding apparatus 41 is transferred to the position adjusting mechanism 210 through the transition 200. Then, the orientation of the upper wafer W1 in the horizontal direction is adjusted by the position adjusting mechanism 210 (process S103).

Thereafter, the upper wafer W1 is delivered from the position adjusting mechanism 210 to the inverting mechanism 220. Then, the front surface and the rear surface of the upper wafer W1 are inverted by the inverting mechanism 220 (process S104). Specifically, the bonding surface W1j of the upper wafer W1 faces downwards.

Subsequently, the upper wafer W1 is delivered from the inverting mechanism 220 to the upper chuck 230 and attracted to and held by the upper chuck 230 (process S105).

While the processes S101 to S105 are performed onto the upper wafer W1, processes are performed onto the lower wafer W2. First, the lower wafer W2 in the cassette C2 is taken out by the transfer device 22 and transferred to the transition device 50 of the third processing block G3.

Then, the lower wafer W2 is transferred by the transfer device 61 to the surface modifying apparatus 30, and the bonding surface W2j of the lower wafer W2 is modified (process S106). This will be described later.

Thereafter, the lower wafer W2 is transferred by the transfer device 61 to the surface hydrophilizing apparatus 40, and the bonding surface W2j of the lower wafer W2 is hydrophilized and then cleaned (process S107).

Then, the lower wafer W2 is transferred by the transfer device 61 to the bonding apparatus 41. The lower wafer W2 carried into the bonding apparatus 41 is transferred to the position adjusting mechanism 210 through the transition 200. Thereafter, the orientation of the lower wafer W2 in the horizontal direction is adjusted by the position adjusting mechanism 210 (process S108).

Then, the lower wafer W2 is transferred to the lower chuck 231 and attracted to and held by the lower chuck 231 in a state where a notch faces a predetermined direction (process S109).

Subsequently, the position of the upper wafer W1 held by the upper chuck 230 and the position of the lower wafer W2 held by the lower chuck 231 in the horizontal direction are adjusted (process S110).

Then, the position of the upper wafer W1 held by the upper chuck 230 and the position of the lower wafer W2 held by the lower chuck 231 in the vertical direction are adjusted (process S111). Specifically, the first moving unit 250 moves the lower chuck 231 in the vertical direction and thus brings the lower wafer W2 closer to the upper wafer W1.

Thereafter, after attraction and holding of the upper wafer W1 by the plurality of inner attraction members 392 is released (process S112), the central portion of the upper wafer W1 is pressed by lowering the pressing pin 281 of the striker 280 (process S113).

When the central portion of the upper wafer W1 is in contact with the central portion of the lower wafer W2 and the central portion of the upper wafer W1 and the central portion of the lower wafer W2 are pressed by the striker 280 with a predetermined force, bonding is started between the central portion of the upper wafer W1 and the central portion of the lower wafer W2. That is, since the bonding surface W1$j$ of the upper wafer W1 and the bonding surface W2$j$ of the lower wafer W2 have been modified, a van der Waals force (an intermolecular force) is generated between the bonding surfaces W1$j$ and W2$j$. Thus, the bonding surfaces W1$j$ and W2$j$ are bonded to each other. Furthermore, since the bonding surface W1$j$ of the upper wafer W1 and the bonding surface W2$j$ of the lower wafer W2 have been hydrophilized, hydrophilic groups between the bonding surfaces W1$j$ and W2$j$ form hydrogen bonds and the bonding surfaces W1$j$ and W2$j$ are firmly bonded to each other. As a result, a bonding region is formed.

Then, a bonding wave is generated between the upper wafer W1 and the lower wafer W2 and thus the bonding region is expanded from the central portions toward the outer peripheral portions of the upper wafer W1 and the lower wafer W2. Thereafter, attraction and holding of the upper wafer W1 by the plurality of outer attraction members 391 is released (process S114). Thus, the outer peripheral portion of the upper wafer W1 attracted to and held by the outer attraction members 391 falls. As a result, the bonding surface W1$j$ of the upper wafer W1 and the bonding surface W2$j$ of the lower wafer W2 are in contact with each other over the entire surfaces, and the combined wafer T is formed.

Thereafter, the pressing pin 281 is raised to the upper chuck 230, and attraction and holding of the lower wafer W2 by the lower chuck 231 is released. Then, the combined wafer T is carried out of the bonding apparatus 41 by the transfer device 61. Thus, a series of bonding processing is ended.

Figure 11:
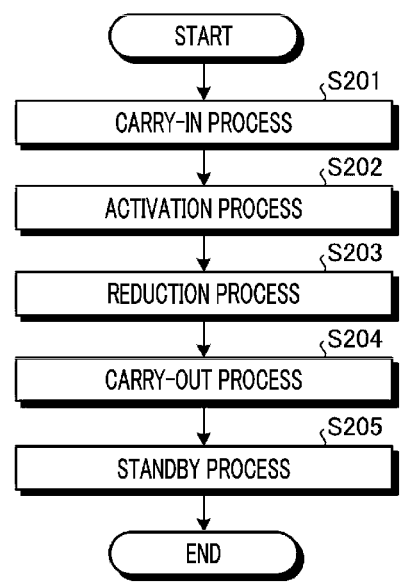
FIG. 11 is a flowchart showing an example of a sequence of a surface modification processing according to the exemplary embodiment.

Hereinafter, the surface modification processing in the process S101 and the process S106 will be described with reference to FIG. 11. FIG. 11 is a flowchart showing an example of a sequence of a surface modification processing according to the exemplary embodiment.

As shown in FIG. 11, in the surface modifying apparatus 30 according to the exemplary embodiment, a carry-in process (process S201), an activation process (process S202), a reduction process (process S203), a carry-out process (process S204) and a standby process (process S205) are performed in this order.

The carry-in process (process S201) is a process of carrying the wafer W into the surface modifying apparatus 30. The activation process is a process mainly of modifying the bonding surface W1$j$ or W2$j$ of the wafer W. The reduction process is a process mainly of removing a metal oxide formed on a surface of a metal (for example, metal wiring such as Cu wiring) when the metal is exposed on the bonding surface W1$j$ or W2$j$. The carry-out process is a process of carrying the wafer W out of the surface modifying apparatus 30. After the wafer W is carried out of the surface modifying apparatus 30, the standby process is performed during a standby time until the carry-in process of carrying a next wafer W into the surface modifying apparatus 30 is started.

As a result of the research conducted by the present inventors, it is found that a ratio between OH radicals and H radicals in plasma can be controlled by changing conditions for plasma formation using a processing gas containing moisture.

Figure 12:
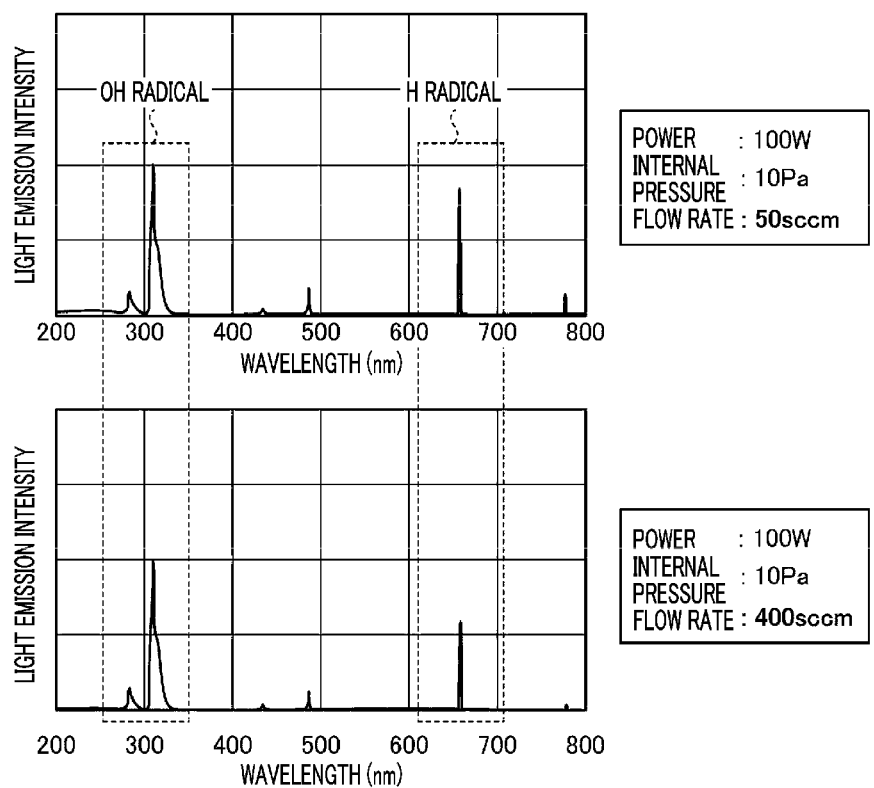
FIG. 12 is a graph showing a measurement result of light emission intensity of OH radicals and H radicals in water vapor plasma.
Figure 13:
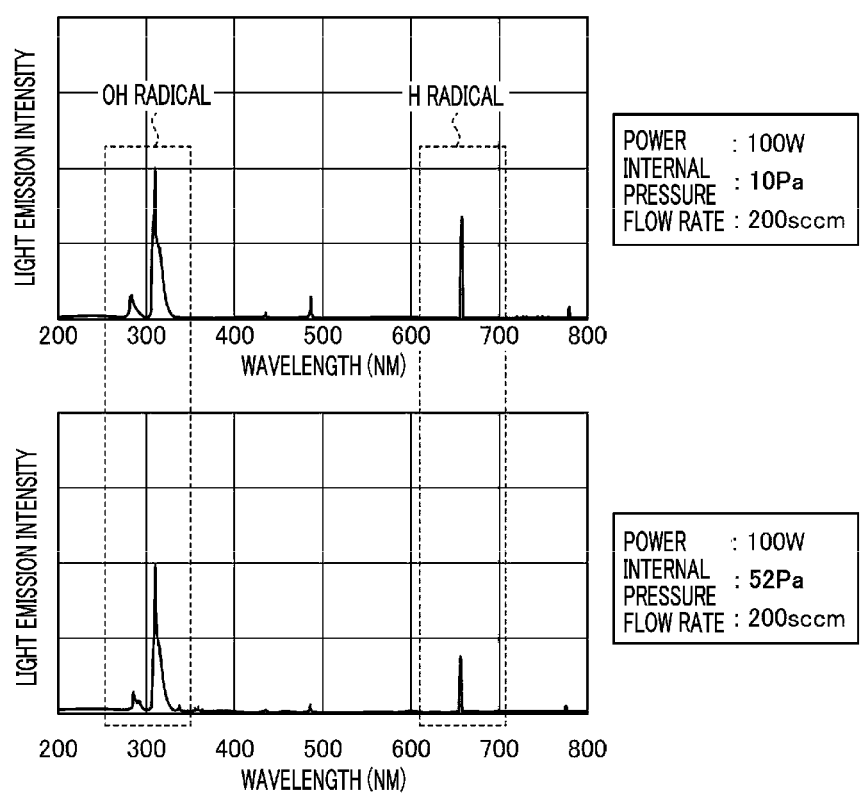
FIG. 13 is a graph showing a measurement result of light emission intensity of OH radicals and H radicals in water vapor plasma.

FIG. 12 and FIG. 13 are graphs showing measurement results of light emission intensity of OH radicals and H radicals in water vapor plasma. FIG. 12 and FIG. 13 show light emission data measured by the spectrophotometer 141 when water vapor plasma is formed in the processing chamber 70. In the graphs shown in FIG. 12 and FIG. 13, the peaks around 310 nm show light emission intensities caused by OH radicals and the peaks around 650 nm show light emission intensities caused by H radicals.

FIG. 12 shows measurement results of light emission intensity of OH radicals and H radicals when the flow rate of the processing gas (water vapor) among the conditions for water vapor plasma formation is changed. Specifically, the upper one of the two graphs shown in FIG. 12 shows a measurement result obtained when water vapor plasma is formed at a power of the high frequency power supply 106 of "100 W", an internal pressure of the processing chamber 70 of "10 Pa" and a flow rate of the processing gas (water vapor) of "50 sccm". Also, the lower one of the two graphs shown in FIG. 12 shows a measurement result obtained when water vapor plasma is formed at a power of the high frequency power supply 106 of "100 W", an internal pressure of the processing chamber 70 of "10 Pa" and a flow rate of the processing gas (water vapor) of "400 sccm". Also, the internal pressure of the processing chamber 70 can be controlled by the APC valve 133 (see FIG. 4).

As shown in FIG. 12, it can be seen that when water vapor plasma is formed at a low flow rate (upper graph in FIG. 12), a ratio of H radicals to OH radicals increases as compared to when water vapor plasma is formed at a high flow rate (lower graph in FIG. 12). One of the reasons is thought to be that, for example, a residence time of gas molecules increases at a low flow rate as compared to at a high flow rate, and, thus, the possibility of electron collisions (ionization) of OH radicals increases and a light emission intensity of H radicals relatively increases while OH radicals are dissociated.

FIG. 13 shows measurement results of light emission intensity of OH radicals and H radicals when the internal pressure of the processing chamber 70 among the conditions for water vapor plasma formation is changed. Specifically, the upper one of the two graphs shown in FIG. 13 shows a measurement result obtained when water vapor plasma is formed at the power of the high frequency power supply 106 of "100 W", the internal pressure of the processing chamber 70 of "10 Pa" and the flow rate of the processing gas (water vapor) of "200 sccm". Also, the lower one of the two graphs shown in FIG. 13 shows a measurement result obtained when water vapor plasma is formed at the power of the high frequency power supply 106 of "100 W", the internal pressure of the processing chamber 70 of "52 Pa" and the flow rate of the processing gas (water vapor) of "200 sccm".

As shown in FIG. 13, it can be seen that when water vapor plasma is formed at a low pressure (upper graph in FIG. 13), a ratio of H radicals to OH radicals increases as compared to when water vapor plasma is formed at a high pressure (lower graph in FIG. 13). One of the reasons is thought to be that, for example, a residence time of gas molecules increases at a low pressure as compared to at a high pressure, and, thus, the possibility of electron collisions (ionization) of OH radicals increases and a light emission intensity of H radicals relatively increases while OH radicals are dissociated.

As described above, the ratio between OH radicals and H radicals in the water vapor plasma can be changed by changing the conditions for water vapor plasma formation. Specifically, the ratio of H radicals to OH radicals can be increased by lowering the flow rate of the processing gas (water vapor) or lowering the internal pressure of the processing chamber 70.

The present inventors also measured light emission intensities of OH radicals and H radicals when the power of the high frequency power supply 106 among the conditions for water vapor plasma formation is changed. As a result, it is found that when water vapor plasma is formed at a high power (800 W), a ratio of H radicals to OH radicals increases as compared to when water vapor plasma is formed at a low power (100 W). One of the reasons is thought to be that, for example, electrons store more energy at the high power than at the low power, and, thus, a light emission intensity of H radicals relatively increases while OH radicals are dissociated. As such, the ratio of H radicals to OH radicals can also be increased by increasing the power of the high frequency power supply 106.

Figure 14:
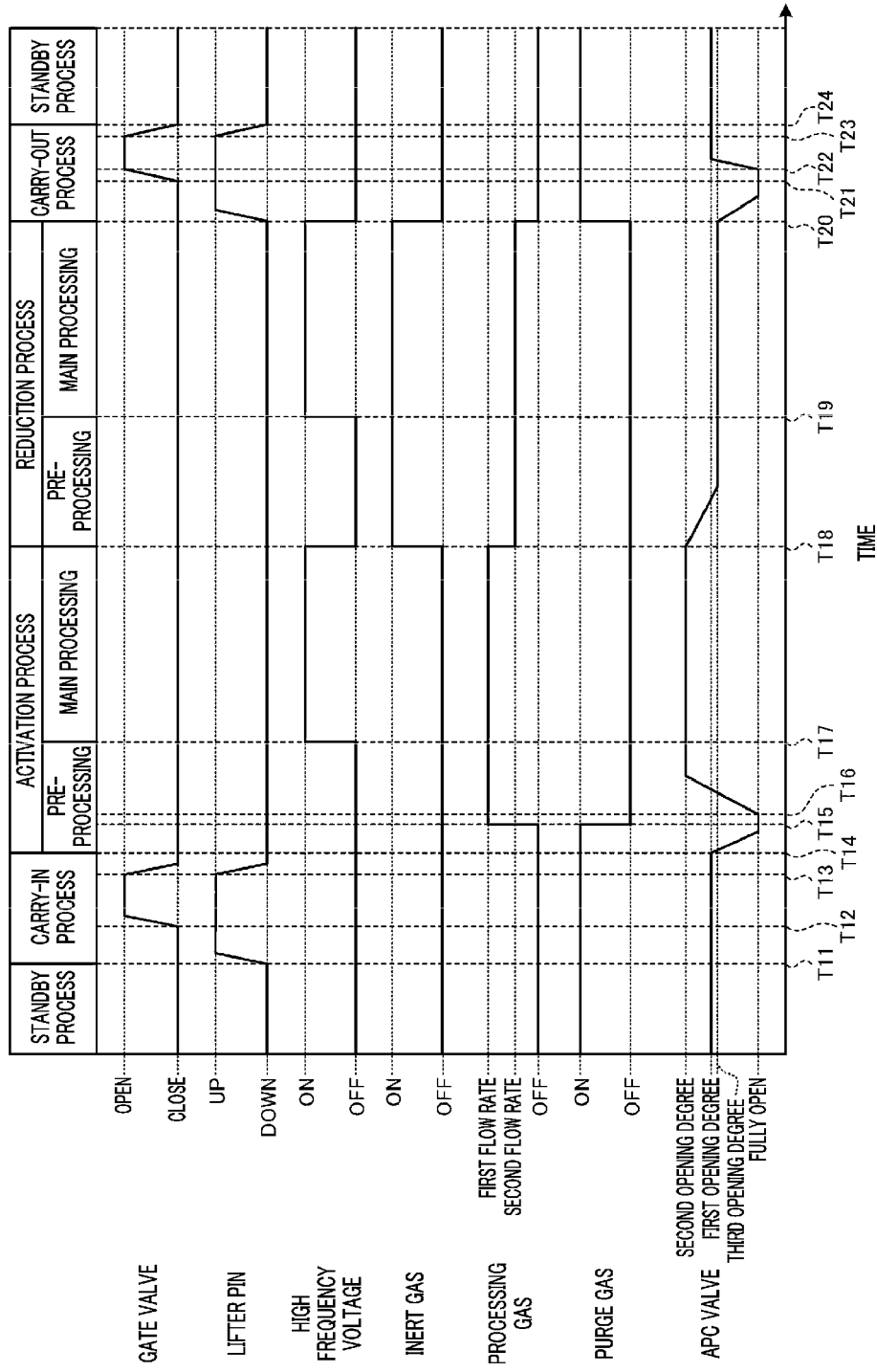
FIG. 14 is a timing chart showing operations of respective components in a surface modification processing according to the exemplary embodiment.

FIG. 14 is a timing chart showing operations of respective components in a surface modification processing according to the exemplary embodiment.

As shown in FIG. 14, in the standby process before the carry-in process is started, the controller 5 controls the opening/closing valve 124d of the purge gas supply 124 to be opened to supply a purge gas (herein, a nitrogen gas) into the processing chamber 70. Also, in the standby process, the controller 5 controls the APC valve 133 to be opened to discharge the purge gas, which has been supplied into the processing chamber 70 from the purge gas supply 124, from the processing chamber 70. In this case, the controller 5 adjusts the opening degree of the APC valve 133 to a first opening degree to adjust the internal pressure of the processing chamber 70 to a predetermined pressure (first pressure).

Then, in the carry-in process, the controller 5 controls the lifter pin (not shown in FIG. 4) to be raised from the stage 80 at a time T11 and controls the gate valve 72 to be opened at a time T12 after a predetermined period of time from the time T11. Thereafter, the controller 5 controls the transfer arm of the transfer device 61 to enter the processing chamber 70 and deliver the upper wafer W1 held by the transfer arm to the lifter pin. Then, the controller 5 controls the gate valve 72 to be closed at a time T13 when the transfer arm of the transfer device 61 is retreated from the processing chamber 70 and controls the lifter pin to be lowered to place the wafer W on the stage 80. Thereafter, the controller 5 adjusts the opening degree of the APC valve 133 to a fully opened state from the first opening degree, which is the initial value, to vacuum-evacuate the inside of the processing chamber 70 at a time T14 after a predetermined period of time from the time T13. Accordingly, the internal pressure of the processing chamber 70 is adjusted to a pressure lower than the first pressure, which is the initial value, from the first pressure.

Then, the controller 5 performs the activation process. First, as a pre-processing of the activation process, the controller 5 controls the supply of the purge gas from the purge gas supply 124 to be stopped and the supply of the processing gas from the processing gas supply 122 to be started at a time T15 after a predetermined period of time from the time T14. Accordingly, the atmosphere within the processing chamber 70 is switched from the purge gas (herein, a nitrogen gas) to the processing gas containing moisture (herein, water vapor).

In this case, the controller 5 controls the processing gas to be supplied into the processing chamber 70 at a first flow rate. For example, the first flow rate is in the range of from 300 sccm to 500 sccm.

Also, at a time T16 after a predetermined period of time from the time T15, the controller 5 adjusts the opening degree of the APC valve 133 to a second opening degree lower than the first opening degree from the fully opened state. Accordingly, the internal pressure of the processing chamber 70 is adjusted to a second pressure higher than the first pressure. For example, the second pressure is in the range of from 20 Pa to 40 Pa.

Then, the controller 5 performs a main processing of the activation process. Specifically, at a time T17 after a predetermined period of time from the time T16, the controller 5 controls the high frequency power supply 106 to apply the high frequency voltage to the stage 80 and form plasma of the processing gas containing moisture (herein, water vapor) within the processing chamber 70.

In the main processing of the activation process, the flow rate of the processing gas (water vapor) is set higher than that of a main processing of the reduction process to be described later. Also, in the main processing of the activation process, the internal pressure of the processing chamber 70 is set higher than that of the main processing of the reduction process.

Since water vapor plasma is formed under these conditions, the ratio of H radicals to OH radicals decreases, i.e., the amount of OH radicals generated increases in the main processing of the activation process as compared to in the main processing of the reduction process. As a result, in the activation process, oxidation of silicon and Si—OH caused by OH radicals is promoted on the bonding surface W1j or W2j of the wafer W. That is, dangling bonds can be formed by removing terminal groups on the bonding surface W1j or W2j, and the dangling bonds can be terminated with OH groups.

Then, as a pre-processing of the reduction process, the controller 5 controls the application of the high frequency voltage to be stopped at a time T18 after a predetermined period of time from the time T17. Also, at the time T18, the controller 5 changes the flow rate of the processing gas (water vapor) from the first flow rate to a second flow rate lower than the first flow rate. For example, the second flow rate is in the range of from 10 sccm to 100 sccm. Further, the controller 5 changes the opening degree of the APC valve 133 from the second opening degree to a third opening degree higher than the first opening degree and the second opening degree. By changing the opening degree of the APC valve 133 to the third opening degree, the internal pressure of the processing chamber 70 is adjusted from the second pressure to a third pressure lower than the second pressure. For example, the third pressure is in the range of from 5 Pa to 15 Pa.

As such, in the reduction process, water vapor plasma is formed at the low flow rate and the low pressure as compared to in the activation process. As a result, in the reduction process, the amount of H radicals generated increases as compared to in the activation process.

Also, at the time T18, the controller 5 controls the supply of the inert gas (herein, a helium gas) from the inert gas supply 123 into the processing chamber 70 to be started. A flow rate of the inert gas is a third flow rate lower than the first flow rate and the second flow rate. For example, the third flow rate is in the range of 5 sccm to 20 sccm.

As such, in the reduction process, the gas (helium gas) different from the water vapor, which is the processing gas, is supplied into the processing chamber 70. Thus, ionization of OH radicals occurs due to the Penning effect. As a result, the amount of H radicals generated may increase. Also, the helium gas having a relatively small mass is used as the inert gas to be mixed with the water vapor. Thus, the damage to the wafer W can be minimized.

Then, the controller 5 performs the main processing of the reduction process. Specifically, at a time T19 after a predetermined period of time from the time T18, the controller 5 controls the high frequency power supply 106 to supply the high frequency voltage to the stage 80 and form water vapor plasma within the processing chamber 70.

In the activation process, a relatively large amount of OH radicals is generated. Therefore, the metal (for example, Cu wiring) exposed on the bonding surface W1j or W2j of the wafer W is easily oxidized. If the upper wafer W1 whose bonding surface W1j is degraded is bonded to the lower wafer W2 whose bonding surface W2j is degraded, the bonding quality of the combined wafer T may be degraded.

Accordingly, the ratio of H radicals to OH radicals in the water vapor plasma increases in the main processing of the reduction process as compared to in the main processing of the activation process. For this reason, in the reduction process, reduction of the metal oxide formed on the surface of the metal exposed on the bonding surface W1j or W2j caused by H radicals is promoted. That is, in the reduction process, the metal oxide can be removed from the surface of the metal exposed on the bonding surface W1j or W2j. By removing the metal oxide, it is possible to improve the bonding quality of the combined wafer T.

Then, when the main processing of the reduction process is finished, the controller 5 performs the carry-out process. Specifically, at a time T20 after a predetermined period of time from the time T19, the controller 5 controls the application of the high frequency voltage to be stopped. Further, at the time T20, the controller 5 controls the supply of the inert gas and the processing gas to be stopped and the supply of the purge gas to be started. Furthermore, the controller 5 controls the lifter pin to be raised from the stage 80 and adjusts the opening degree of the APC valve 133 from the third opening degree to the fully opened state.

Then, the controller 5 controls the gate valve 72 to be opened at a time T21 after a predetermined period of time from the time T20 and adjusts the opening degree of the APC valve 133 from the fully opened state to the first opening degree at a time T22 after a predetermined period of time from the time T21 to change the internal pressure of the processing chamber 70 back to the initial pressure. In this state, the controller 5 controls the transfer arm of the transfer device 61 to enter the processing chamber 70 and delivers the modified wafer W placed on the stage 80 to the transfer arm. Thereafter, the controller 5 controls the transfer device 61 to transfer the modified wafer W to the surface hydrophilizing apparatus 40.

Then, the controller 5 controls the gate valve 72 to be closed and controls the lifter pin to be lowered at a time T23 after a predetermined period of time from the time T22. Thereafter, at a time T24, the controller 5 progresses the standby process from the carry-out process.

Herein, for example, if the nitrogen gas is used as the processing gas, the bonding strength tends to decrease when the power (high frequency voltage) of the high frequency power supply is increased. As such, in the conventional surface modifying apparatus using the nitrogen gas as the processing gas, a process window (optimal range) of the high frequency voltage is relatively narrow, which needs to be solved to improve the bonding quality of the combined wafer T.

In this regard, the present inventors found that if the surface modification processing is performed using the processing gas containing moisture (water vapor), the bonding strength is less likely to decrease even when the high frequency voltage is increased as compared to the case where the nitrogen gas is used. That is, the present inventors found that when the surface modification processing is performed using the processing gas containing moisture (water vapor), the process window (optimal range) of the high frequency voltage is widened. As such, when the processing gas containing moisture (water vapor) is used, easiness to control the surface modification processing can be improved as compared to when the nitrogen gas is used. Thus, the bonding quality of the combined wafer T can be stabilized. In other words, the bonding quality of the combined wafer T can be improved.

Also, when the surface modification processing is performed using the processing gas containing moisture (water vapor), OH groups can be formed on a wafer having the bonding surface W1j or W2j on which O does not exist, for example, a wafer including a silicon carbon nitride layer (SiCN layer) on the bonding surface W1j or W2j.

Modification Example

Figure 15:
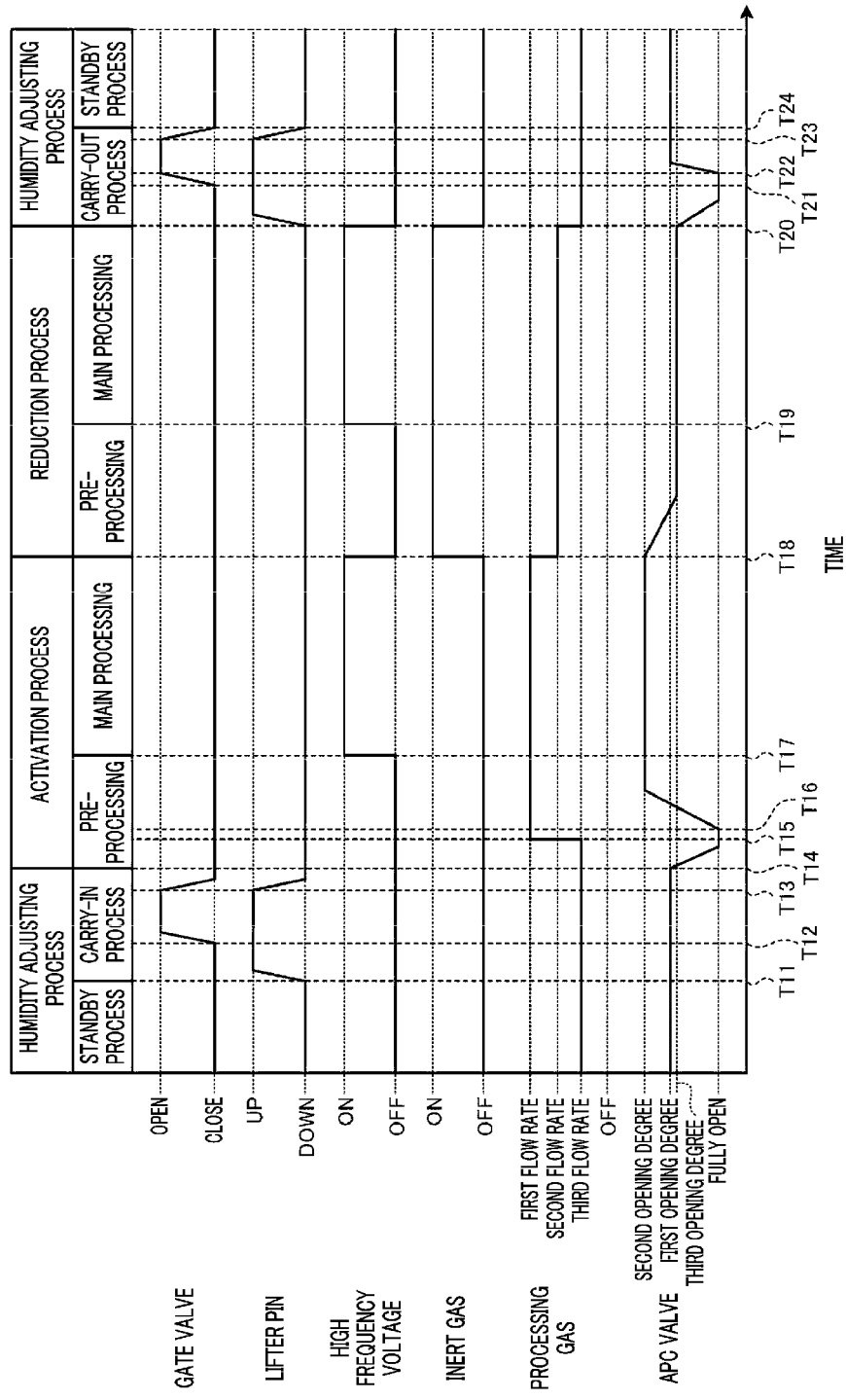
FIG. 15 is a timing chart showing operations of respective components in a surface modification processing according to a modification example.

FIG. 15 is a timing chart showing operations of respective components in a surface modification processing according to a modification example. As shown in FIG. 15, the controller 5 may perform a humidity adjusting process of adjusting the amount of moisture within the processing chamber 70 before the activation process and the reduction process are started.

As a result of the research conducted by the present inventors, it is found that the formation of dangling bonds on the bonding surfaces W1j and W2j of the upper wafer W1 and the lower wafer W2 is promoted by adjusting the amount of moisture within the processing chamber 70 of the surface modifying apparatus 30. Therefore, in the standby process and the carry-in process, the controller 5 may supply the processing gas containing moisture (water vapor) into the processing chamber 70 as a humidity adjusting gas instead of the purge gas to adjust the amount of moisture within the processing chamber 70.

Although it is illustrated in the example shown in FIG. 15 that water vapor is supplied at a predetermined flow rate (fourth flow rate) in the humidity adjusting process, the controller 5 may change the flow rate of the water vapor serving as the humidity adjusting gas depending on the amount of moisture within the processing chamber 70.

Specifically, when the humidity adjusting gas is supplied into the processing chamber 70, the controller 5 may measure a value indicating the amount of moisture within the processing chamber 70 by using, for example, the mass spectrometer 142. In this case, the controller 5 may control the flow rate of or water content in the water vapor serving as the humidity adjusting gas based on the measured value indicating the amount of moisture within the processing chamber 70.

For example, when the surface modification of the wafer W is performed repeatedly a predetermined number of times within the processing chamber 70, the amount of moisture within the processing chamber 70 is gradually decreased by vacuum evacuation.

The controller 5 measures an analysis value measured by the mass spectrometer 142 as the value indicating the amount of moisture within the processing chamber 70. Further, the controller 5 controls the flow rate of or the water content in the humidity adjusting gas based on the measured analysis value. As the amount of moisture within the processing chamber 70 decreases, the analysis value measured by the mass spectrometer 142 decreases. For example, the controller 5 determines whether or not the amount of moisture within the processing chamber 70 is lower than a predetermined lower limit by determining whether the measured analysis value is equal to or lower than a predetermined threshold value. If it is determined that the amount of moisture within the processing chamber 70 is lower than the predetermined lower limit, the controller 5 controls the processing gas supply 122 to increase the flow rate of or the water content in the humidity adjusting gas. Accordingly, the controller 5 can appropriately adjust the amount of moisture within the processing chamber 70.

The following may be a reason why the decrease in bonding strength between the upper wafer W1 and the lower wafer W2 bonded to each other is suppressed by modifying the bonding surfaces W1*j* and W2*j* of the wafers W in a state where the amount of moisture within the processing chamber 70 is adjusted.

That is, in the present exemplary embodiment, by supplying the humidity adjusting gas into the processing chamber 70, which can accommodate therein the upper wafer W1, before the modification of the upper wafer W1, the amount of moisture within the processing chamber 70 is adjusted. Thus, the amount of moisture within the processing chamber 70 is increased and a large amount of moisture ($H_2O$) is present around the bonding surface W1*j* of the upper wafer W1.

In this state, the surface modification processing of the upper wafer W1 is performed with the plasma of the nitrogen gas, which is the processing gas. In this case, among nitrogen ions in a first excitation level and nitrogen ions in a second excitation level included in the plasma of the nitrogen gas, an energy of the nitrogen ions in the first excitation level with a lower activity is transitioned to moisture ($H_2O$) around the bonding surface W1*j*.

Accordingly, the nitrogen ions in the first excitation level are lost from the processing chamber 70, whereas the nitrogen ions in the second excitation level with a higher activity than the nitrogen ions in the first excitation level is increased in ratio. As a result, it is possible to radiate the nitrogen ions in the second excitation level with a higher activity onto the bonding surface W1*j* while suppressing nitrification by the nitrogen ions in the first excitation level. Thus, it is possible to promote the formation of dangling bonds of silicon atoms on the uppermost surface of the bonding surface W1*j*. Meanwhile, since the nitrification by the nitrogen ions in the first excitation level is suppressed on the uppermost surface of the bonding surface W1*j*, the formation of the nitrified portion is suppressed.

In this state, if the upper wafer W1 is carried out of the surface modifying apparatus 30 and exposed to the atmospheric atmosphere, the dangling bonds of silicon atoms are terminated with OH groups due to moisture ($H_2O$) in the atmosphere.

In this case, since the formation of the nitrified portion is suppressed on the uppermost surface of the bonding surface W1*j*, the generation of OH groups is not suppressed by the nitrified portion.

Then, the bonding surfaces W1*j* and W2*j* of the upper wafer W1 and the lower wafer W2 carried out of the surface modifying apparatus 30 are hydrophilized in the surface hydrophilizing apparatus 40, and then, bonded to each other in the bonding apparatus 41. In the bonding processing, the bonding is expanded from central portions to peripheral portions of the wafers W by hydrogen bonding between OH groups on the bonding surface W1*j* and OH groups on the bonding surface W2*j*.

In the present exemplary embodiment, since the formation of the nitrified portion is suppressed on the uppermost surface of the bonding surface W1*j*, the described-above bonding caused by OH groups is not suppressed by the nitrified portion. That is, in the present exemplary embodiment, by adjusting the amount of moisture within the processing chamber 70, it is possible to suppress the formation of the nitrified portion that suppresses the formation of Si—O—Si bonds from the OH groups. Therefore, according to the present exemplary embodiment, it is possible to suppress the decrease in the bonding strength between the upper wafer W1 and the lower wafer W2 bonded to each other.

In the above-described exemplary embodiment, it has been described that the activation process and the reduction process are sequentially performed. However, the controller 5 may perform the activation process and the reduction process in a reverse order. That is, the controller 5 may sequentially perform the reduction process and the activation process.

Further, in the above-described exemplary embodiment, it has been described that both the activation process and the reduction process are performed. However, the controller 5 may perform any one of the activation process and the reduction process. For example, the controller 5 may perform only the activation process onto the wafer W having the bonding surface W1*j* or W2*j* on which a metal is not exposed without performing the reduction process.

Furthermore, in the above-described exemplary embodiment, it has been described that after the surface modification processing is performed in the surface modifying apparatus 30, a surface hydrophilization processing is performed in the surface hydrophilizing apparatus 40. However, the surface modifying apparatus 30 according to the exemplary embodiment can form OH groups on the bonding surfaces W1*j* and W2*j* in the activation process. For this reason, the controller 5 may skip the surface hydrophilization processing depending on, for example, the type of the wafer W.

Moreover, in the above-described exemplary embodiment, it has been described that water vapor is used as the processing gas containing moisture. However, the processing gas containing moisture is not limited to water vapor, and may be, for example, an ammonia gas and a hydrogen gas. Herein, water vapor is desirable as the processing gas containing moisture in view of easiness to control and cost.

In the above-described exemplary embodiment, it has been described that the processing gas containing moisture is used in both the activation process and the reduction process. However, the present disclosure is not limited thereto. For example, the controller 5 may use a processing gas (for example, an inert gas such as a nitrogen gas) other than the processing gas containing moisture in the activation process and may use the processing gas containing moisture in the reduction process.

In the above-described exemplary embodiment, it has been described that the ratio between OH radicals and H radicals is controlled by changing all of the flow rate of the processing gas, the internal pressure of the processing chamber and the supply of the inert gas. However, the present disclosure is not limited thereto. The controller 5 may change at least one of the flow rate of the processing gas, the internal pressure of the processing chamber or the supply of the inert gas.

<Effects>

As described above, a bonding system according to the exemplary embodiment includes a surface modifying apparatus (as an example, the surface modifying apparatus 30) and a bonding apparatus (as an example, the bonding apparatus 41). The surface modifying apparatus is configured to modify a bonding surface (as an example, the bonding surfaces W1*j* and W2*j*) of a substrate (as an example, the upper wafer W1 and the lower wafer W2) to be bonded to another substrate (as an example, the upper wafer W1 and the lower wafer W2) with plasma of a processing gas. The bonding apparatus is configured to bond two substrates modified by the surface modifying apparatus by an intermolecular force. The surface modifying apparatus includes: a processing chamber (as an example, the processing chamber 70) configured to accommodate therein the substrate; a processing gas supply (as an example, the processing gas supply 122) configured to supply a processing gas (as an example, the water vapor) containing moisture into the processing chamber; and a plasma forming unit (as an example, the stage 80, the power feed rod 104, the matching unit 105, the high frequency power supply 106 and the upper electrode 110) configured to form the plasma of the processing gas containing the moisture.

Accordingly, a decrease in the amount of moisture within the processing chamber is suppressed by supplying the processing gas containing moisture into the processing chamber. Thus, a decrease in bonding strength caused by a decrease in the amount of moisture can be suppressed. Therefore, the bonding system according to the exemplary embodiment can improve the bonding quality of the combined substrate.

The plasma forming unit generates OH radicals and H radicals by exciting the processing gas containing the moisture into the plasma. Accordingly, for example, when a metal (Cu wiring or the like) is exposed on the bonding surface, a metal oxide formed on the surface of the metal can be removed by reducibility of H radicals. Thus, the states of the bonding surfaces W1*j* and W2*j* can be made better. Therefore, the bonding quality of the combined substrate can be improved. Also, oxidation of silicon and Si—OH caused by OH radicals can be promoted.

The surface modifying apparatus includes: an inert gas supply (as an example, the inert gas supply 123) configured to supply an inert gas into the processing chamber; and an opening/closing valve (as an example, the opening/closing valve 123*d*) provided in a supply line of the inert gas (as an example, the inert gas supply line 123*b*) from the inert gas supply into the processing chamber. Accordingly, for example, in the surface modification processing, the processing gas containing moisture and the inert gas may be supplied into the processing chamber or the supply of the inert gas may be stopped and only the processing gas containing moisture may be supplied into the processing chamber.

The bonding system according to the exemplary embodiment includes a controller (as an example, the controller 5) configured to control the surface modifying apparatus. The controller controls the surface modifying apparatus to perform an activation process of supplying the processing gas containing the moisture into the processing chamber and processing the substrate with the plasma of the processing gas containing the moisture, and a reduction process of supplying the processing gas containing the moisture and the inert gas into the processing chamber and processing the substrate with plasma of the processing gas containing the moisture and the inert gas. Accordingly, for example, in the activation process, oxidation of silicon and Si—OH caused by OH radicals can be promoted, and in the reduction process, a metal oxide formed on the surface of the metal exposed on the bonding surface can be removed by H radicals.

The controller supplies the processing gas containing the moisture at a first flow rate in the activation process, and supplies the processing gas containing the moisture at a second flow rate lower than the first flow rate and the inert gas at a third flow rate lower than the first flow rate in the reduction process. Accordingly, the ratio of H radicals to OH radicals in the activation process can be set lower than that in the reduction process. That is, the amount of OH radicals generated may be increased in the activation process and the amount of H radicals generated may be increased in the reduction process.

The bonding system according to the exemplary embodiment includes a controller configured to control the surface modifying apparatus. The controller controls the surface modifying apparatus to perform an activation process of supplying the processing gas containing the moisture into the processing chamber at a first flow rate and processing the substrate with the plasma of the processing gas containing the moisture, and a reduction process of supplying the processing gas containing the moisture into the processing chamber at a second flow rate lower than the first flow rate and processing the substrate with the plasma of the processing gas containing the moisture. Accordingly, for example, in the activation process, oxidation of silicon and Si—OH caused by OH radicals can be promoted, and in the reduction process, a metal oxide formed on the surface of the metal exposed on the bonding surface can be removed by H radicals.

The controller performs the reduction process after the activation process. Accordingly, for example, a metal oxide formed on the surface of the metal exposed on the bonding surface in the activation process can be removed in the reduction process.

The inert gas is a helium gas. Accordingly, damage to the substrate can be minimized.

The controller controls the surface modifying apparatus to perform a humidity adjusting process of adjusting an amount of moisture within the processing chamber by supplying the processing gas containing the moisture into the processing chamber before starting the activation process and the reduction process. Accordingly, it is possible to suppress non-uniformity in the state of plasma in the activation process and the reduction process depending on the amount of moisture within the processing chamber.

While the present disclosure has been described with reference to the exemplary embodiments, the present disclosure is not limited to the exemplary embodiments but may be variously modified without departing from the spirit thereof.

For example, in the above-described exemplary embodiment, it has been described that plasma P of the processing gas is formed using a plasma forming apparatus of a surface wave plasma (SWP) type, an inductively coupled plasma (ICP) type or an electron cyclotron resonance (ECR) type. However, the plasma forming apparatus according to the exemplary embodiment is not limited thereto, and any plasma forming apparatus can be used as long as it can form plasma P of a processing gas using microwaves M.

The exemplary embodiments disclosed herein are illustrative in all aspects and do not limit the present disclosure. In fact, the above exemplary embodiments can be embodied in various forms. Further, the above-described exemplary embodiments may be omitted, replaced and modified in various ways without departing from the scope and the spirit of the appended claims.

According to the present disclosure, it is possible to improve the bonding quality of the combined substrate.

From the foregoing, it will be appreciated that various exemplary embodiments of the present disclosure have been described herein for purposes of illustration and various changes can be made without departing from the scope and spirit of the present disclosure. Accordingly, various exemplary embodiments described herein are not intended to be limiting, and the true scope and spirit are indicated by the following claims.

We claim:

1. A bonding system, comprising:
a surface modifying apparatus configured to modify a bonding surface of a substrate to be bonded to another substrate with plasma of a processing gas;
a bonding apparatus configured to bond two substrates modified by the surface modifying apparatus by an intermolecular force; and
a controller configured to control the surface modifying apparatus,
wherein the surface modifying apparatus includes:
a processing chamber configured to accommodate therein the substrate;
a processing gas supply configured to supply a processing gas containing moisture into the processing chamber;
a plasma forming unit configured to form the plasma of the processing gas containing the moisture,
an inert gas supply configured to supply an inert gas into the processing chamber; and
an opening/closing valve provided in a supply line of the inert gas from the inert gas supply into the processing chamber,
wherein the controller controls the surface modifying apparatus to perform an activation process of supplying the processing gas containing the moisture into the processing chamber and processing the substrate with the plasma of the processing gas containing the moisture, and a reduction process of supplying the processing gas containing the moisture and the inert gas into the processing chamber and processing the substrate with plasma of the processing gas containing the moisture and the inert gas.

2. The bonding system of claim 1,
wherein the plasma forming unit generates OH radicals and H radicals by exciting the processing gas containing the moisture into the plasma.

3. The bonding system of claim 1,
wherein the controller supplies the processing gas containing the moisture at a first flow rate in the activation process, and supplies the processing gas containing the moisture at a second flow rate lower than the first flow rate and the inert gas at a third flow rate lower than the first flow rate in the reduction process.

4. A bonding system, comprising:
a surface modifying apparatus configured to modify a bonding surface of a substrate to be bonded to another substrate with plasma of a processing gas;
a bonding apparatus configured to bond two substrates modified by the surface modifying apparatus by an intermolecular force, and
a controller configured to control the surface modifying apparatus,
wherein the surface modifying apparatus includes:
a processing chamber configured to accommodate therein the substrate;
a processing gas supply configured to supply a processing gas containing moisture into the processing chamber; and
a plasma forming unit configured to form the plasma of the processing gas containing the moisture,
wherein the controller controls the surface modifying apparatus to perform an activation process of supplying the processing gas containing the moisture into the processing chamber at a first flow rate and processing the substrate with the plasma of the processing gas containing the moisture, and a reduction process of supplying the processing gas containing the moisture into the processing chamber at a second flow rate lower than the first flow rate and processing the substrate with the plasma of the processing gas containing the moisture.

5. The bonding system of claim 1,
wherein the controller performs the reduction process after the activation process.

6. The bonding system of claim 1,
wherein the inert gas is a helium gas.

7. The bonding system of claim 1,
wherein the controller controls the surface modifying apparatus to perform a humidity adjusting process of adjusting an amount of moisture within the processing chamber by supplying the processing gas containing the moisture into the processing chamber before starting the activation process and the reduction process.

* * * * *